United States Patent
Aiuchi et al.

(10) Patent No.: US 8,060,244 B2
(45) Date of Patent: Nov. 15, 2011

(54) SUBSTRATE PROCESSING APPARATUS AND CARRIER ADJUSTING SYSTEM

(75) Inventors: Takashi Aiuchi, Kumamoto (JP);
Akihito Suzuki, Kumamoto (JP);
Hirotsugu Kamamoto, Kumamoto (JP);
Shuichi Yonemura, Kumamoto (JP);
Takashi Imafu, Kumamoto (JP);
Kazuhisa Sakamoto, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 325 days.

(21) Appl. No.: 11/889,923

(22) Filed: Aug. 17, 2007

(65) Prior Publication Data
US 2007/0293970 A1     Dec. 20, 2007

Related U.S. Application Data

(62) Division of application No. 10/482,997, filed as application No. PCT/JP02/06937 on Jul. 9, 2002, now abandoned.

(30) Foreign Application Priority Data

Jul. 12, 2001 (JP) ................ 2001-212178
Jul. 19, 2001 (JP) ................ 2001-219177

(51) Int. Cl.
*G06F 7/00* (2006.01)

(52) U.S. Cl. ................................... 700/225
(58) Field of Classification Search ............. 705/26, 705/27; 700/225, 213, 228
See application file for complete search history.

(56) References Cited

U.S. PATENT DOCUMENTS

| | | | |
|---|---|---|---|
| 4,321,898 A * | 3/1982 | Latsch | 123/254 |
| 5,030,057 A | 7/1991 | Nishi et al. | |
| 5,231,585 A | 7/1993 | Kobayashi et al. | |
| 5,839,187 A | 11/1998 | Sato et al. | |
| 5,867,389 A | 2/1999 | Hamada et al. | |
| 5,944,894 A | 8/1999 | Kitano et al. | |
| 6,050,389 A * | 4/2000 | Iida et al. | 198/341.01 |

(Continued)

FOREIGN PATENT DOCUMENTS

EP     0 467 257 A2     1/1992

(Continued)

OTHER PUBLICATIONS

JPO Notification of Reason for Refusal, App. No. 2003-513021, Dispatch No. 287982, Dispatch Date: May 27, 2008 (4 pages total).

(Continued)

*Primary Examiner* — Ramya Prakasam
(74) *Attorney, Agent, or Firm* — Rader, Fishman & Grauer PLLC

(57) ABSTRACT

An object of the present invention is to perform replacement of parts of a substrate processing apparatus more rapidly than that by the prior art. The present invention is a substrate processing apparatus constituted of a plurality of component parts for performing predetermined processing for a substrate, identification marks being attached to the respective component parts, the apparatus including: a storage unit for storing part information on each of the component parts necessary when placing an order for a component part, in correspondence with the identification mark; an input unit for inputting an identification mark of a component part to be ordered; and a display unit for displaying the part information in the storage unit corresponding to the inputted identification mark.

4 Claims, 31 Drawing Sheets

U.S. PATENT DOCUMENTS

| | | | | |
|---|---|---|---|---|
| 6,143,040 | A * | 11/2000 | Tometsuka et al. | 29/25.01 |
| 6,321,898 | B1 * | 11/2001 | Inoue et al. | 198/465.1 |
| 6,332,898 | B1 * | 12/2001 | Tometsuka et al. | 29/25.01 |
| 6,516,239 | B1 * | 2/2003 | Madden et al. | 700/115 |
| 6,577,723 | B1 * | 6/2003 | Mooney | 379/221.08 |
| 6,633,787 | B1 | 10/2003 | Sekitani | |
| 6,640,431 | B1 * | 11/2003 | Yoriki et al. | 29/834 |
| 2002/0004761 | A1 | 1/2002 | Sekitani | |
| 2002/0042761 | A1 | 4/2002 | Murray | |
| 2002/0095348 | A1 | 7/2002 | Hiroshige et al. | |
| 2002/0111709 | A1 * | 8/2002 | DiStasio et al. | 700/213 |

FOREIGN PATENT DOCUMENTS

| | | |
|---|---|---|
| EP | 0 822 473 A2 | 2/1998 |
| EP | 0822473 A2 | 2/1998 |
| EP | 1 058 175 A2 | 12/2000 |
| GB | 2 210 996 A | 6/1989 |
| JP | 02-002888 A | 1/1990 |
| JP | 10-09796 A1 | 4/1998 |
| JP | 10-135094 A1 | 5/1998 |
| JP | 11-015520 A1 | 1/1999 |
| JP | 11-162826 A | 6/1999 |
| JP | 2000-349133 A | 12/2000 |
| JP | 2001-344473 A1 | 12/2001 |
| WO | WO-01/26068 A1 | 4/2001 |

OTHER PUBLICATIONS

EPO Search Report, App. No. 02743874.6-1528, Oct. 30, 2007 (7 pages).

Lut De Maertelaere, "Internet Data Transfer", Printed Circuit Fabrication, vol. 22, No. 1, Jan. 1999, pp. 52-54.

* cited by examiner

SUBSTRATE PROCESSING APPARATUS AND CARRIER ADJUSTING SYSTEM

The present application is a Divisional application of the patent application Ser. No. 10/482,997, filed Jan. 8, 2004, which claims priority to application JP2001-212178 filed on Jul. 12, 2001 and application JP2001-219177 filed on Jul. 19, 2001, the entire contents of which are incorporated herein by reference.

BACKGROUND OF THE INVENTION

1. Field of the Invention

The present invention relates to a substrate processing apparatus and a carrier adjusting system.

2. Description of the Related Art

Manufacturing of semiconductor devices is performed in a coating and developing apparatus, an aligner, an etching apparatus and the like which are placed in a factory. A photolithography process, for example, in the manufacturing of semiconductor devices is performed in the coating and developing apparatus, which is typically mounted with a plurality of processing units such as a resist coating unit for forming a resist film on a wafer surface, a developing unit for performing developing treatment for the wafer after exposure, a baking processing unit for performing baking processing after the resist coating, before and after the developing treatment, and so on. Further, the coating and developing apparatus is provided with many kinds of carrier arms, and transfer of substrates between the respective processing units, and transfer of a treatment solution supply nozzle and the like inside a predetermined processing unit are performed by these carrier arms.

Incidentally, when a problem occurs to such a coating and developing apparatus and the problem is not solved promptly, restart of the wafer processing is delayed, and therefore availability of the coating and developing apparatus is reduced, which is not favorable.

For example, when a part constituting the coating and developing apparatus is broken or the like, an apparatus manager on a wafer manufacturer side needs to place an order for a part with a parts supplier or the like in order to replace the part. In this event, the apparatus manager needs to specify the name of the broken part, the part number, and so on in order to place an order for a part.

The coating and developing apparatus, however, has many kinds of processing units as described above and is thus constituted of many parts. In addition, typically, the apparatus manager on the wafer manufacturer side who places an order is not familiar with the parts of the coating and developing apparatus. Therefore, when placing an order for a part, the apparatus manager on the wafer manufacturer side cannot specify the name of a part to be ordered and so on in many cases, and therefore often inquires, when necessary, of a person in charge on a side of a vendor of the coating and developing apparatus.

In the inquiry of the person in charge on the vendor side as described above every time a part is broken, it takes time to specify the part and place an order, and thus it takes a long time to obtain a new part, failing to rapidly replace the part. This results in a long time for recovery of a breakage or the like and thus a delay in restart of the wafer processing, leading to reduced availability of the coating and developing apparatus.

Incidentally, when a problem occurs to the wafer processed in the above-described coating and developing apparatus, a considerable cause thereof is a problem of the aforesaid carrier arm. Namely, it is considered that a stop position at a destination of the aforesaid carrier arm is displaced, and that an object to be carried such as a wafer is not carried to a suitable position. In such a situation, it is necessary to adjust the stop position of the carrier arm to solve the problem of the processed wafer. However, so-called position adjustment, which is stop position adjustment of the carrier arm, is fine adjustment that requires care, and an operator performing the adjustment needs plentiful knowledge and experience. In some cases, the carrier arm is positioned at an industrial robot due to its handling risk, and a predetermined license is required. Consequently, when the position adjustment of the carrier arms is to be performed, a manager on the side of the factory of the coating and developing apparatus asks a person in charge on the side of a vender, who has plentiful knowledge and experience, for adjustment, and the person in charge visits the factory side and makes the adjustment.

However, it takes a considerably long time by the time the person in charge of the vender side reaches the factory side from the time when the problem occurs to the processed wafer. Especially when the factory is located at a remote place such as a foreign country, it is conspicuous. When a long time is required for adjustment of the position of the carrier arm as this, processing of wafers cannot be performed during that time, and therefore availability of the coating and developing apparatus is reduced, which is not favorable.

Even the persons in charge on the side of the vender differ in their individual knowledge and experience, and also differ in their skill in the adjusting operation. Consequently, when a plurality of persons in charge are sent to a plurality of factories, there arises a difference in accuracy of adjustment in each of the persons in charge. Such difference in accuracy directly affects the processing accuracy of wafers, and therefore the wafers with different quality are manufactured in each factory, for example, which is not favorable.

SUMMARY OF THE INVENTION

The present invention is made in view of the above points, and an object thereof is to provide a substrate processing apparatus for a wafer or the like in which replacement of parts of the processing apparatus is promptly performed in order to prevent a reduction in availability of a processing apparatus such as a coating and developing apparatus or the like due to a problem thereof. Further, another object thereof is to provide a carrier adjusting system capable of promptly and uniformly performing adjustment of a stop position at a destination with respect to a carrier such as a carrier arm, and a substrate processing apparatus thereof.

The present invention is a substrate processing apparatus constituted of a plurality of component parts for performing predetermined processing for a substrate, identification marks being attached to the respective component parts, the apparatus comprising: a storage unit for storing part information on each of the component parts necessary when placing an order for a component part, in correspondence with the identification mark; an input unit for inputting an identification mark of a component part to be ordered; and a display unit for displaying the part information in the storage unit corresponding to the inputted identification mark.

According to this invention, by inputting the identification mark of the broken component part through the input unit, the part information on the broken component part is displayed on the display unit. This allows an apparatus manager of a substrate manufacturer to get to know quickly the name, the part number, and so on of the broken part, and to immediately place an order for a replacement part. Therefore, part replacement can be rapidly performed without making an inquiry via a telephone or the like of a person in charge on the vendor side. As a result of this, the problem of the processing apparatus can be solved at an early stage, whereby a reduction in availability of the processing apparatus can be prevented.

Note that the identification marks are not always necessarily attached directly to the component parts, but may be attached to, for example, bags of the component parts or attached to a list or the like of the component parts. Besides, the part information includes the part name, the part number, the parts supplier's name, the telephone number of the parts supplier, stock information, and so on. The component parts are parts in units in sale, and include, for example, various kinds of nozzles, various kinds of filters, heat plates, processing containers, heater, pipes, motors, controllers, screws, bolts, and so on.

The substrate processing apparatus of the present invention may further comprises a communication unit for obtaining via the Internet the part information in the storage unit from a main storage unit on a side of a vendor of the processing apparatus. In this case, it is possible to sequentially update the part information in the storage unit so as to obtain more detailed and later part information.

According to another aspect of the present invention, the present invention is a substrate processing apparatus constituted of a plurality of component parts for performing predetermined processing for a substrate, identification marks being attached to the respective component parts, the apparatus comprising: an input unit for inputting, when placing an order for a component part, the identification mark of the component part; a transmitter for transmitting via the Internet the inputted identification mark to a side of a vendor of the processing apparatus; a receiver for receiving via the Internet part information on the component part transmitted from the vendor based on the transmitted identification mark; and a display unit for displaying the received part information.

According to the present invention, the apparatus manager of the substrate manufacturer can obtain the part information on the broken part transmitted from the vendor side via the Internet. This allows the apparatus manager of the substrate manufacturer to rapidly place an order for a part, thus enabling a rapid replacement of the part. Further, the part information stored on the vendor side can be obtained, and therefore more detailed and later part information can be obtained.

According to still another aspect of the present invention, the present invention is a substrate processing apparatus constituted of a plurality of component parts for performing predetermined processing for a substrate, comprising: a storage unit for storing part information on each of the component parts and specification information for specifying each of the component parts necessary when placing an order for a component part; an input unit for inputting specification information for a component part to be ordered; a search unit for searching a component part matching with the inputted specification information from the storage unit; and a display unit for displaying component part candidate information on the searched component part and displaying the part information in the storage unit on a component part selected from the component part candidate information.

According to the present invention, the apparatus manager of the substrate manufacturer can select a component part of the same kind as that of the broken component part from the component part candidate information to obtain the part information on the broken part. This allows the apparatus manager of the substrate manufacturer to specify a part to be ordered and rapidly place an order for the part. It should be noted that the aforementioned component part candidate information may include the part information and include other information, for example, image information on the component part and so on. Besides, the aforementioned specification information includes, for example, the dimensions of specific portions of the component part, generic name for the component part, the unit name in use, and so on.

According to yet another aspect of the present invention, the present invention is a substrate processing apparatus constituted of a plurality of component parts for performing predetermined processing for a substrate, comprising: a storage unit for storing part information on each of the component parts necessary when placing an order for the component part, an image pickup unit for picking up an image of a component part to be ordered; a transmitter for transmitting via the Internet image pickup information on the component part whose image is picked up by the image pickup unit to a side of a vendor of the processing apparatus; a receiver for receiving via the Internet component part candidate information derived on the vendor side based on the image pickup information; and a display unit for displaying the received component part candidate information and displaying the part information in the storage unit on a component part selected from the component part candidate information.

According to another aspect of the present invention, the present invention is a substrate processing apparatus constituted of a plurality of component parts for performing predetermined processing for a substrate, comprising: a storage unit for storing part information on each of the component parts necessary when placing an order for the component part, an image pickup unit for picking up an image of a component part to be ordered; a transmitter for transmitting via the Internet image pickup information on the component part whose image is picked up by the image pickup unit to a side of a vendor of the processing apparatus; a receiver for receiving via the Internet a specification result of a component part specified on the vendor side based on the image pickup information; and a display unit for displaying the part information in the storage unit on the specified component part.

According to further another aspect of the present invention, the present invention is a substrate processing apparatus constituted of a plurality of component parts for performing predetermined processing for a substrate, comprising: an image pickup unit for picking up an image of a component part to be ordered; a transmitter for transmitting via the Internet image pickup information on the component part whose image is picked up by the image pickup unit to a side of a vendor of the processing apparatus; a receiver for receiving via the Internet part information on a component part specified on the vendor side based on the image pickup information; and a display unit for displaying the received part information, wherein the part information is information on the component part necessary when placing an order for the component part.

Since the substrate processing apparatus of the present invention includes the image pickup unit as described above, the apparatus manager of the substrate manufacturer can specify the broken part based on the image pickup information of the broken component part. Therefore, the apparatus manager on the processing apparatus side can specify the broken part based on the image pickup information and perform part replacement more promptly even if there is no clue on the component part such as the identification mark.

The substrate processing apparatus of the present invention may further comprise an obtaining unit for obtaining via the Internet stock information on the component part to be ordered. Note that the stock information includes the number of stock items, the parts supplier having stock items, and so on.

According to still another aspect of the present invention, the present invention is a carrier adjusting system, which adjusts a stop position at a destination with respect to a carrier that carries an object to be carried such as a substrate or a treatment solution supplying member, in which the aforesaid carrier is mounted on a substrate processing apparatus; on a side of a factory in which the aforesaid processing apparatus is placed, a control device which controls the stop position of the aforesaid carrier, and a detector which detects an actual stop position of the destination of the aforesaid carrier are provided; and on a side of a vender of the aforesaid processing apparatus, an obtaining device which obtains detection information detected by the aforesaid detector via Internet, and a providing device which provides correction information to correct the stop position of the aforesaid carrier, which is derived based on the obtained detection information, to the aforesaid processing apparatus via the Internet are provided.

According to the present invention, the stop position of the carrier is adjusted based on the correction information provided from the side of the vender via the Internet. Consequently, the person in charge on the side of the vendor does not need to visit the factory side each time, and the position adjustment can be promptly performed. In addition, it becomes possible that one skilled person performs adjustment of a plurality of factories or processing apparatuses, and uniform adjustment with high quality can be performed.

The aforesaid providing device may directly output the aforesaid correction information to the aforesaid control device via the aforesaid Internet, and may be able to directly correct the stop position at the destination of the aforesaid carrier.

The aforesaid carrier carries the substrate; and the aforesaid image pickup device may be provided at a detecting substrate in a same shape as the substrate.

Further, the aforesaid carrier carries the substrate; the aforesaid image pickup device may be provided to be fixed to the aforesaid processing apparatus to be able to pick up an image of the detecting substrate carried to the stop position of the aforesaid carrier; the aforesaid detecting substrate may be given a mark by which a position of this detecting substrate after being carried is recognized on an image of the aforesaid image pickup device; and a reference mark on a occasion of adjusting the stop position of the aforesaid carrier may be displayed on a screen on which the image of the aforesaid image pickup device is displayed. It should be noted that the number of reference marks on the aforesaid detecting substrate and the screen can be optionally selected. As for the mark of the detecting substrate, a plurality of them may be provided on the same radius of the aforesaid detecting substrate.

In the carrier adjusting system of the present invention, the aforesaid processing apparatus may be provided with a waiting part at which the aforesaid detecting substrate is waited; the aforesaid carrier may be able to carry the aforesaid detecting substrate waited at the aforesaid waiting part. The carrier of which position is adjusted may directly access the waiting part so as to be able to carry the aforesaid waiting detecting substrate, or it may be enabled to carry the aforesaid detecting substrate indirectly, for example, via another carrier. The carrier may be made operable by the host computer or the like on the side of the vender, and the detecting substrate at the waiting part may be carried to the carrier by the remote operation from the side of the vender.

According to yet another aspect of the present invention, the present invention is a substrate processing apparatus comprising a carrier which carries an object to be carried such as a substrate or a treatment solution supplying member, comprising a control device which controls a stop position of a destination of the aforesaid carrier, a detector which detects an actual stop position of the destination of the aforesaid carrier, a transmitter which transmits detection information detected at the aforesaid detector to a side of a vender of the aforesaid processing apparatus via Internet, and a receiver which receives correction information to correct the stop position at the destination of the aforesaid carrier, which is derived based on the transmitted detection information, via the Internet.

According to the present invention, the person in charge on the side of the vender can perform the position adjustment for the carrier without visiting the factory side.

DETAILED DESCRIPTION OF THE PREFERRED EMBODIMENTS

Figure 1:
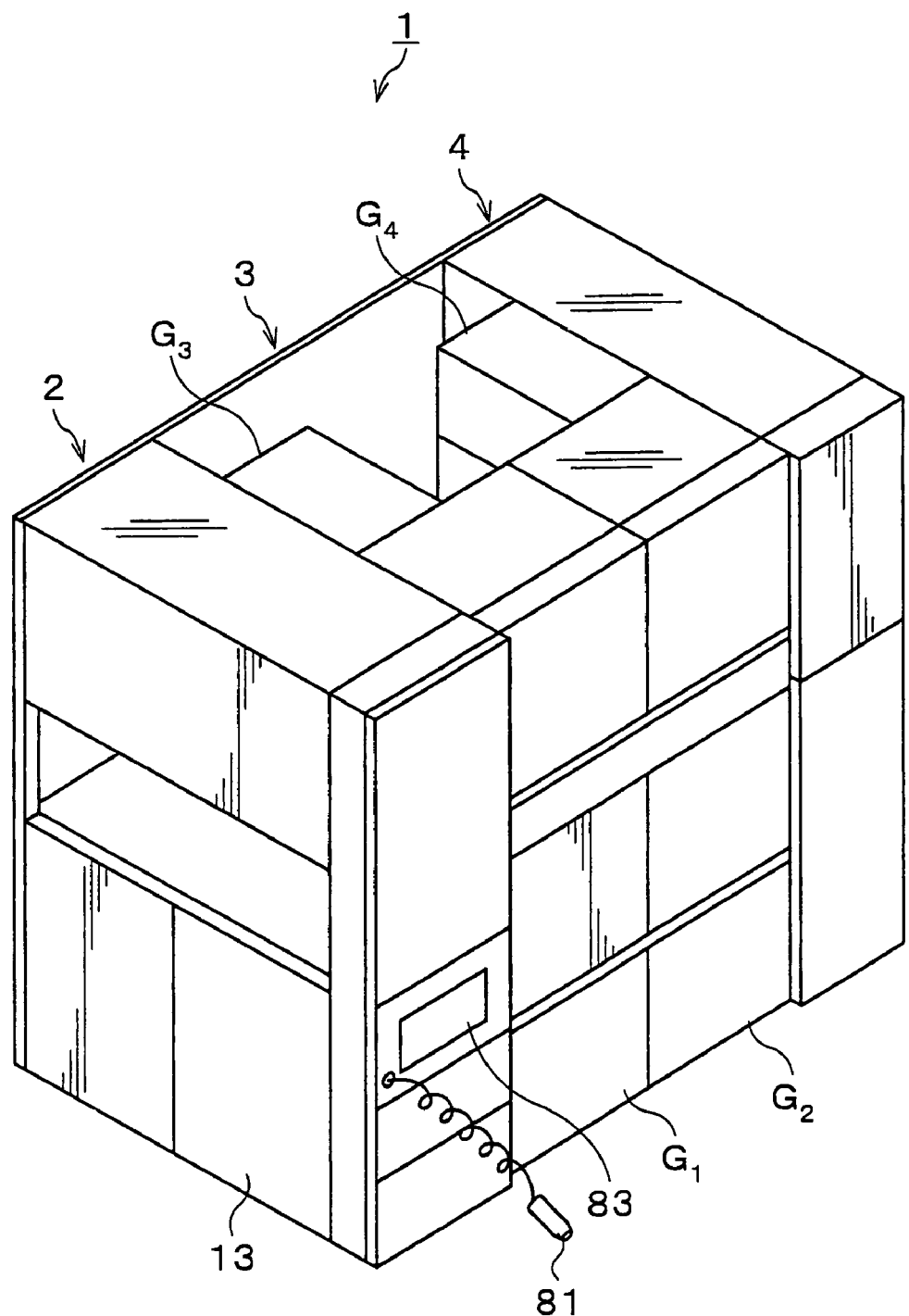
FIG. 1 is a perspective view showing an outline of a coating and developing apparatus according to this embodiment.

Preferred embodiments of the present invention will be explained below. FIG. 1 is a perspective view showing an outline of a configuration of a coating and developing apparatus 1 as a substrate processing apparatus according to this embodiment, and FIG. 2 is a plan view of the coating and developing apparatus 1.

Figure 2:
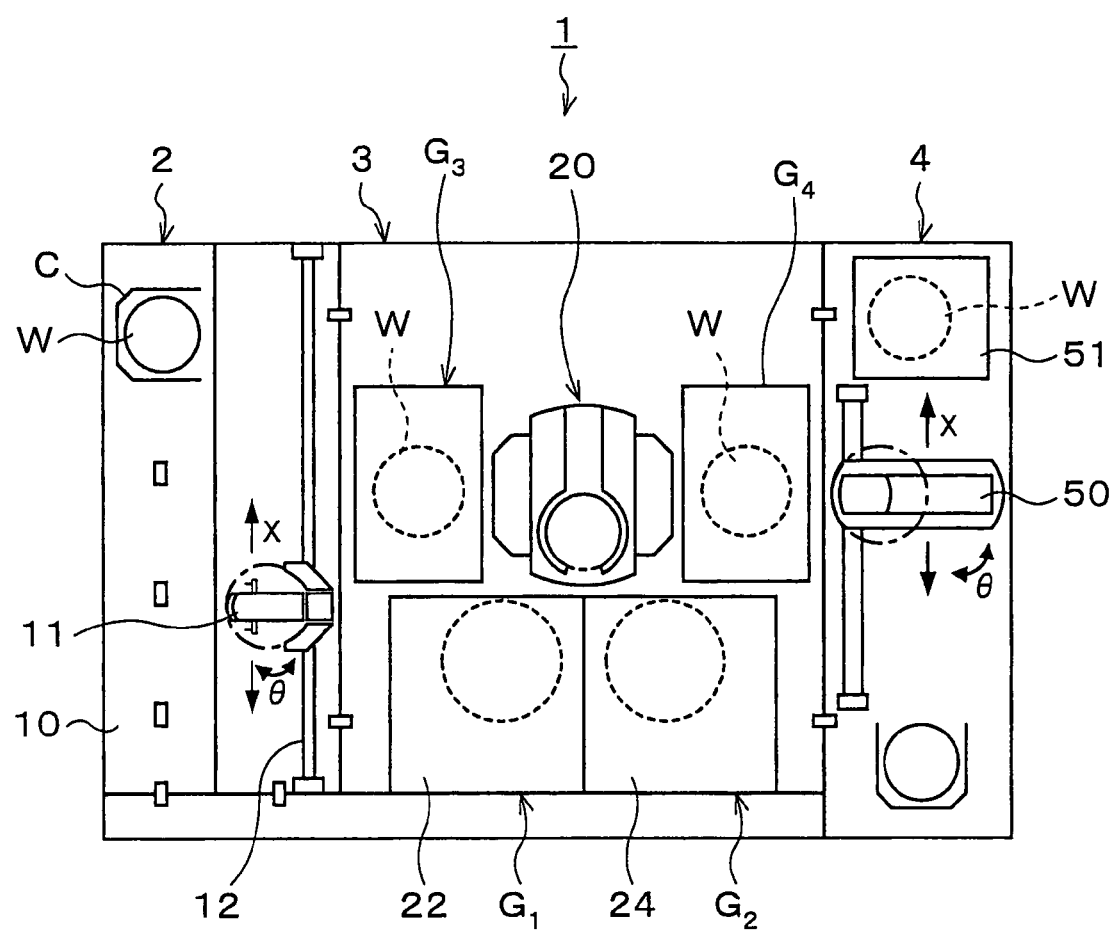
FIG. 2 is a plan view showing the outline of a configuration of the coating and developing apparatus.

As shown in FIG. 1 and FIG. 2, the coating and developing apparatus 1 has, for example, a structure in which a cassette station 2 for carrying, for example, 25 wafers W per cassette, as a unit, from/to the outside into/out of the coating and developing apparatus 1 and carrying the wafers W into/out of a cassette C, a processing station 3 including a plurality of various kinds of processing units for performing processing for the wafers W in a single wafer processing system, and an interface section 4 for delivering the wafers W to/from a not-shown aligner provided adjacent to the processing station 3, are integrally connected.

In the cassette station 2, a plurality of cassettes C can be freely mounted at predetermined positions on a cassette mounting table 10 as shown in FIG. 2 in a line in an X-direction (a top-to-bottom direction in FIG. 2). Further, in the cassette station 2, a wafer carrier unit 11 is provided to be movable along a carrier path 12 in the X-direction. The wafer carrier unit 11 is capable of carrying the wafers W into the cassette C, and getting access and carrying the wafers W also to an extension unit 33 included in a third processing unit group G3 on the processing station 3 side which will be described later. Further, the cassette station 2 is provided with a later-described order part specifying section 13 of the coating and developing apparatus 1 as shown in FIG. 1.

Figure 3:
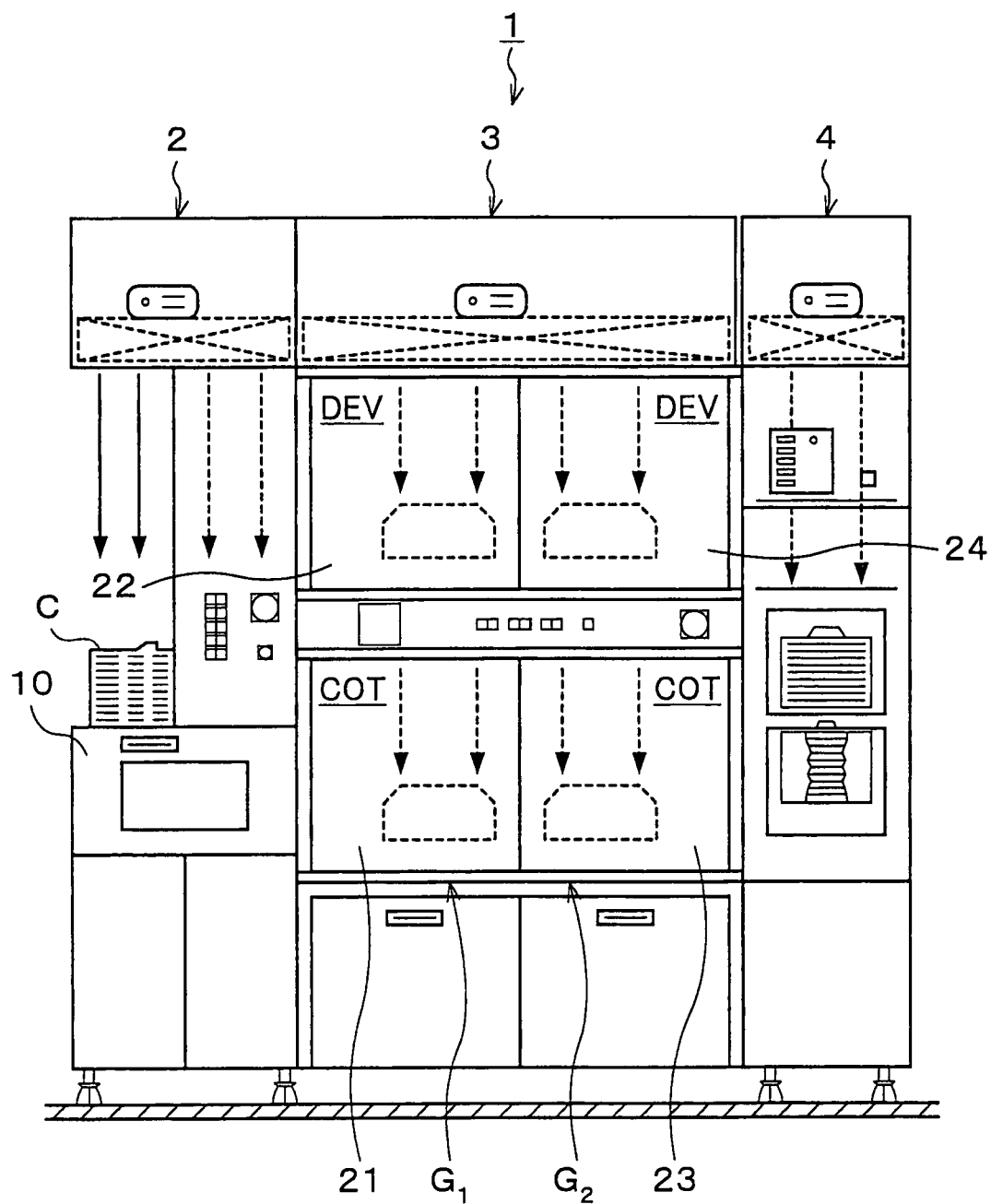
FIG. 3 is a front view of the coating and developing apparatus in FIG. 2.

In the processing station 3, as shown in FIG. 2, a main carrier unit 20 is provided at the center thereof, and a plurality of processing unit groups G1, G2, G3, and G4, in which various kinds of the processing units are stacked in multiple tiers, are provided around the main carrier unit 20. For example, the first and second processing unit groups G1 and G2 are placed on the front side of the coating and developing apparatus 1, and in the first processing unit group G1, as shown in FIG. 3, a resist coating unit 21 for applying a resist solution to the wafer W to form a resist film and a developing unit 22 for subjecting the wafer W to developing treatment, are stacked in two tiers from the bottom in order. In the second processing unit group G2, a resist coating unit 23 and a developing unit 24 are similarly stacked in two tiers from the bottom in order.

Figure 4:
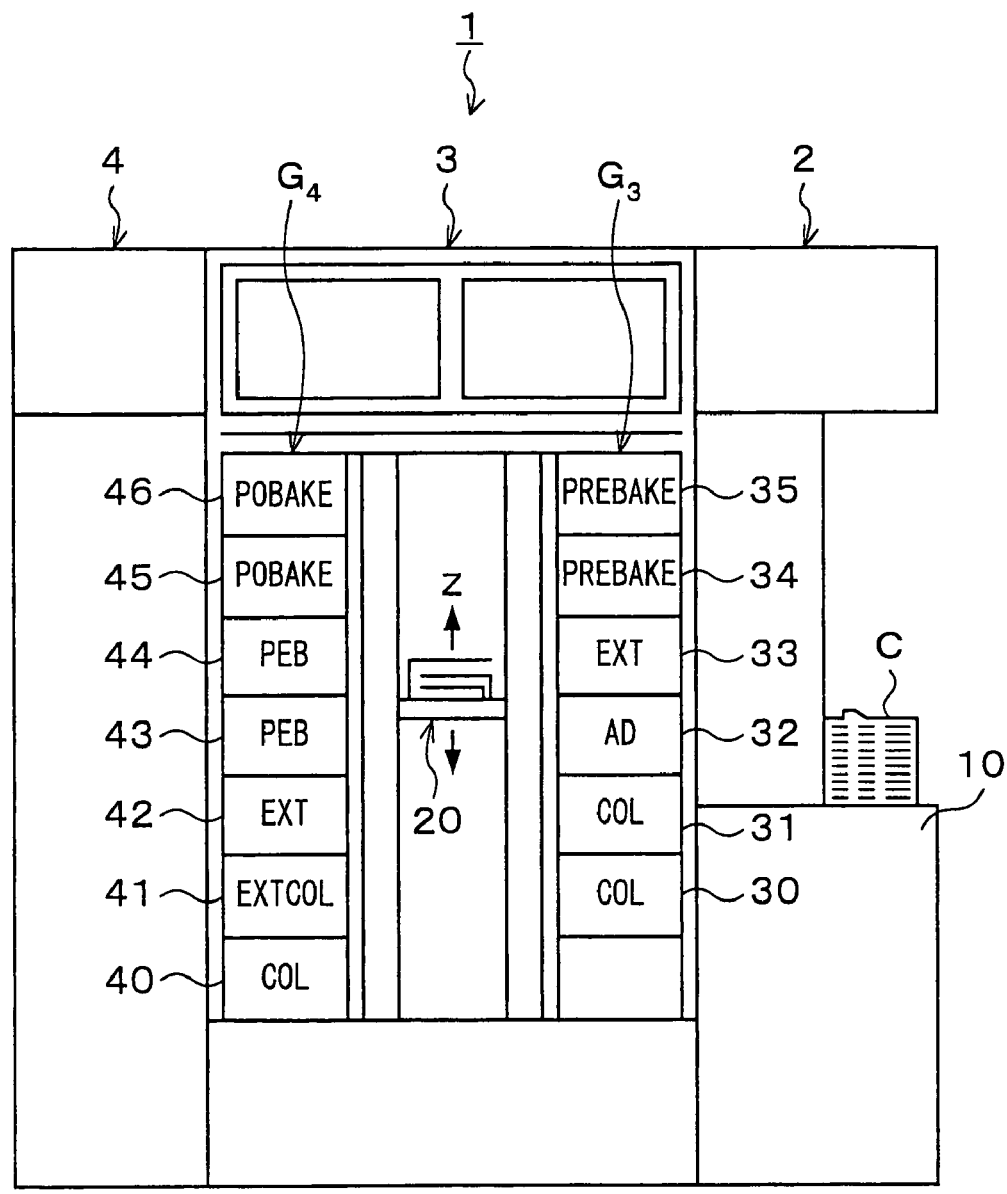
FIG. 4 is a rear view of the coating and developing apparatus in FIG. 2.

The third processing unit group G3 in the processing station 3 is, as shown in FIG. 2, placed adjacent to the cassette station 2. In the third processing unit group G3, as shown in FIG. 4, for example, cooling units 30 and 31 for subjecting the wafers W to cooling processing, an adhesion unit 32 for enhancing adhesion between the resist solution and the wafer W, an extension unit 33 for delivering the wafer W, and pre-baking units 34 and 35 for evaporating a solvent in the resist solution, are stacked, for example, in six tiers from the bottom in order.

The fourth processing unit group G4 is placed adjacent to the interface station 4. In the fourth processing unit group G4, for example, a cooling unit 40, an extension and cooling unit 41 for allowing the wafer W mounted thereon to spontaneously cool, an extension unit 42, post-exposure baking units 43 and 44 for performing baking processing after exposure, and post-baking units 45 and 46 for performing baking processing after developing treatment, are stacked, for example, in seven tiers from the bottom in order.

In the interface section 4, as shown in FIG. 2, for example, a wafer carrier unit 50 and an edge exposure unit 51 are provided. The wafer carrier unit 50 is structured to be able to get access and carry the wafers W respectively to the extension and cooling unit 41 and extension unit 42 included in the fourth processing unit group G4, the edge exposure unit 51, and the not-shown aligner.

Next, the configuration of the aforementioned order part specifying section 13 is described in detail. The above-described coating and developing apparatus 1 has many component parts. When one of the component parts are broken due to operation or the like of the coating and developing apparatus 1, an apparatus manager of the coating and developing apparatus 1 needs to specify the part name, the part number, and so on of the broken part and place an order with a predetermined parts supplier. The order part specifying section 13 is a section for specifying the part name and so on of a broken component part when placing an order for a replacement part.

Figure 5:
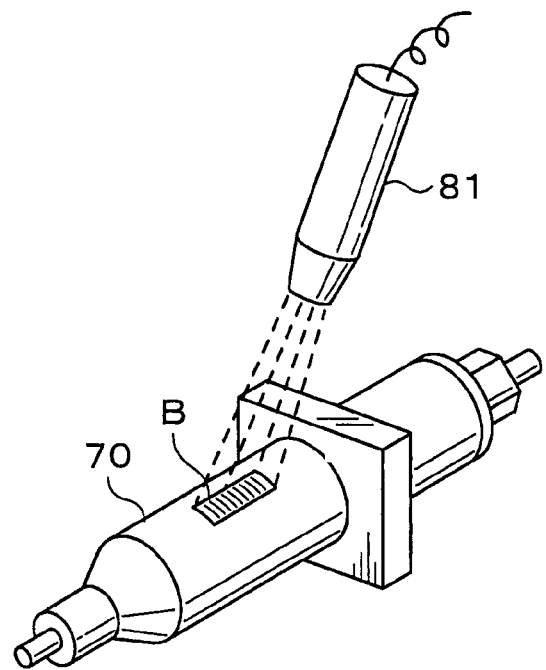
FIG. 5 is a perspective view showing an example in which a barcode is attached to a resist solution discharge nozzle.

A barcode as an identification mark is attached to the surface of each of the component parts of the coating and developing apparatus 1. FIG. 5 shows an example thereof in which a barcode B is attached, for example, to a resist solution discharge nozzle 70 used in the resist coating unit 21. The barcode B is for identifying it from other component parts and therefore has a code specific to the resist solution discharge nozzle 70. In addition, the component parts include ones associated with the above-described various kinds of units, ones associated with the coating and developing apparatus 1 itself, and also ones associated with devices for supplying liquid, gas, and the like to the coating and developing apparatus 1, to each of which a barcode is attached.

Figure 6:
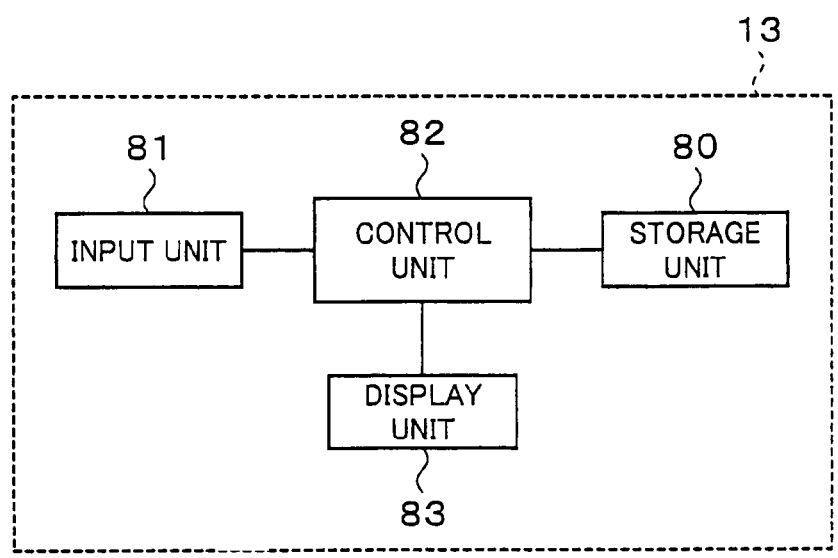
FIG. 6 is a block diagram showing a configuration of an order part specifying section.

The order part specifying section 13 is constituted of, for example, a storage unit 80, an input unit 81, a control unit 82, a display unit 83, and so on as shown in FIG. 6.

The storage unit 80 is constituted of, for example, a RAM or the like and stores part information on each of the component parts of the coating and developing apparatus 1 in correspondence with the barcode of the component part. The part information includes, for example, the part name and the part number of a part to be ordered, the name of parts supplier, and the telephone number of the parts supplier.

The input unit 81 is, for example, a barcode reader and can read the barcode attached to the component part as shown in FIG. 5. It should be noted that the input unit 81 is provided, for example, on the front side of the cassette station 2 of the coating and developing apparatus 1 as shown in FIG. 1.

The control unit 82 is constituted of, for example, a CPU or the like, reads from the storage unit 80 the part information corresponding to a barcode inputted from the input unit 81, and displays it on the later-described display unit 83. Further, the control unit 82 also controls the entire order part specifying section 13.

Figure 7:
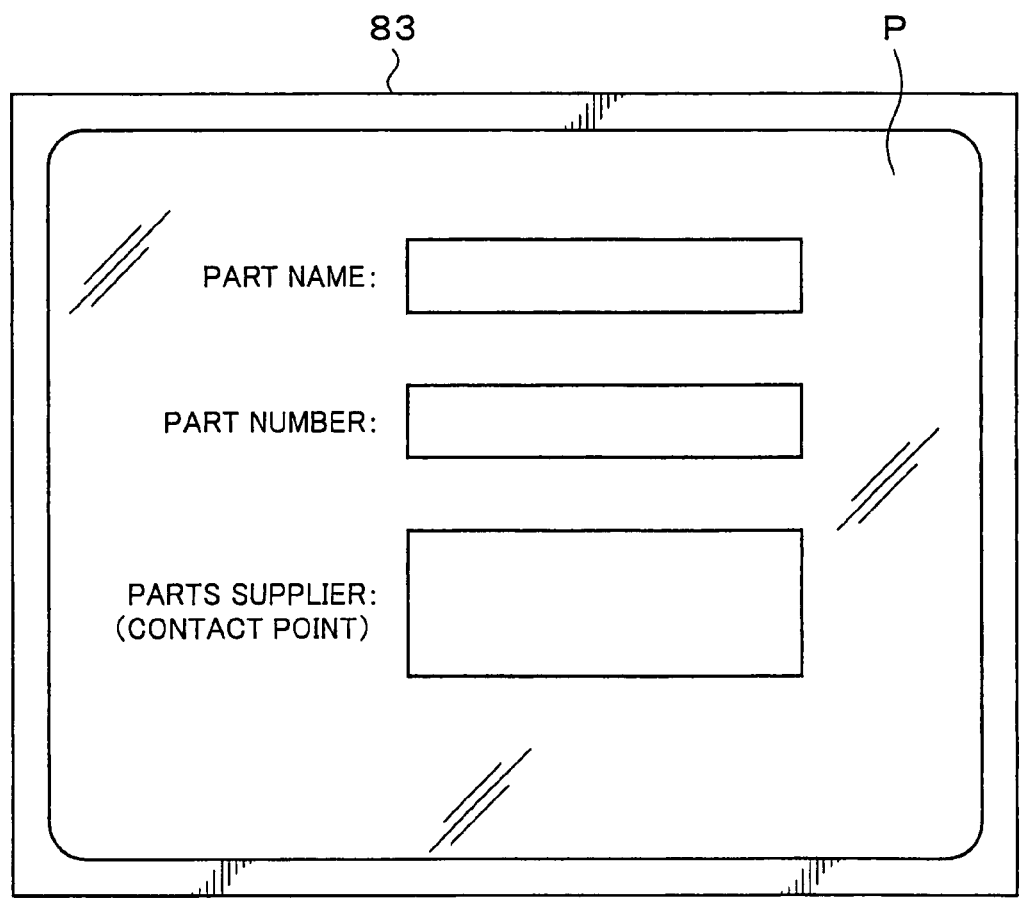
FIG. 7 is an explanatory view showing a form of a part information screen.

The display unit 83 is constituted of, for example, a dot matrix-type color liquid crystal display cell, a CRT, or the like, and provided on the front side of the cassette station 2 as shown in FIG. 1. On the display unit 83, for example, a part information screen P of the part information read from the storage unit 80 as shown in FIG. 7. In the part information screen P, for example, the part name, the part number, and the parts supplier and its point of contact which are used when placing an order, are displayed in a list form.

Figure 8:
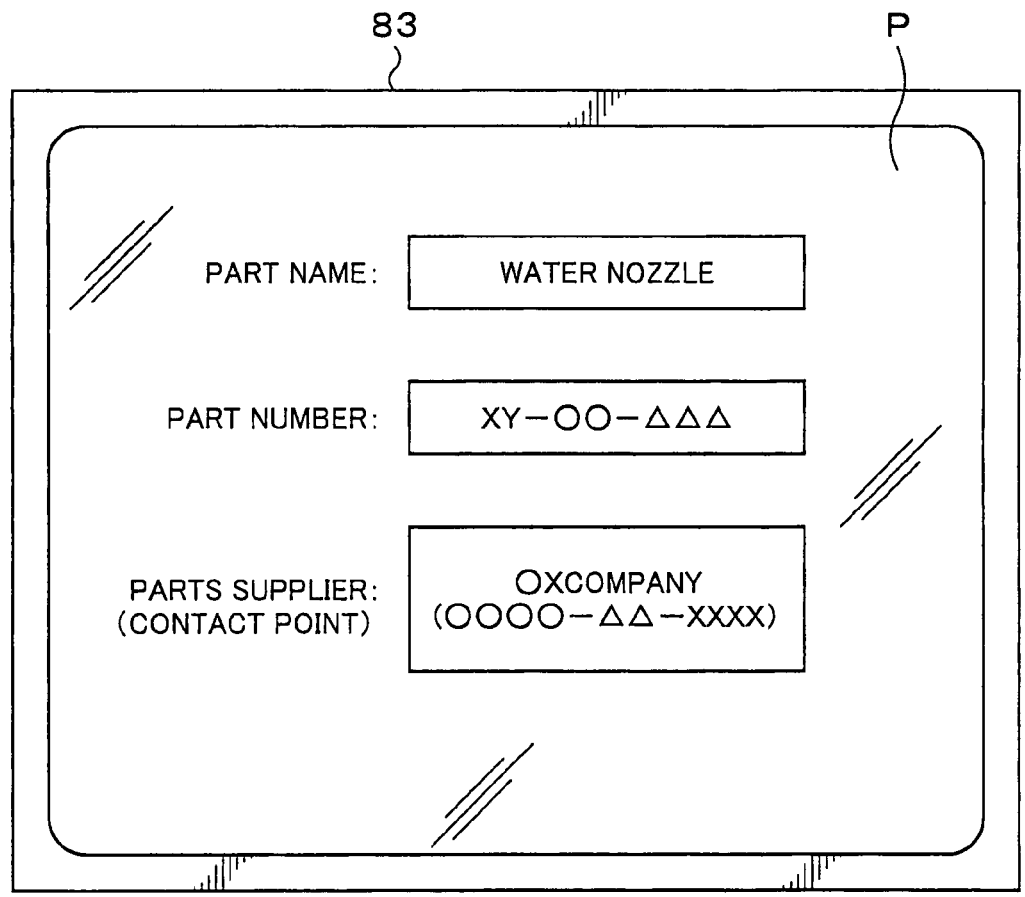
FIG. 8 is an explanatory view showing a display example of the part information screen in FIG. 7.

Next, an order part specifying process in the coating and developing apparatus 1 having the above configuration is described with an example of a case in which the resist solution discharge nozzle 70 being a component part is broken. First, the apparatus manager disconnects, for example, the broken resist solution discharge nozzle 70 from the resist coating unit 21. Then, the manager holds the input unit 81 being the barcode reader toward the barcode B on the resist solution discharge nozzle 70 to read the barcode B. When the barcode B is read, part information which is stored in correspondence with the barcode B is read from the storage unit 80, and a part information screen P for the resist solution discharge nozzle 70 is displayed on the display unit 83 as shown in FIG. 8. This allows the apparatus manager to obtain the part information on the resist solution discharge nozzle 70 necessary when placing an order, make contact with the parts supplier immediately, and place an order for a replacement part therefor.

Although barcodes are used as the identification marks in the above embodiment, other identification marks, for example, letters, numbers, and the like are also employable. In this case, the input unit 81 may be a keyboard or the like provided with cursor keys, number keys, and so on.

Further, the part information may include image information on each of the components. This allows the apparatus manager to compare a specified part with a broken component part to thereby reconfirm whether the part to be ordered is correct or not.

Figure 9:
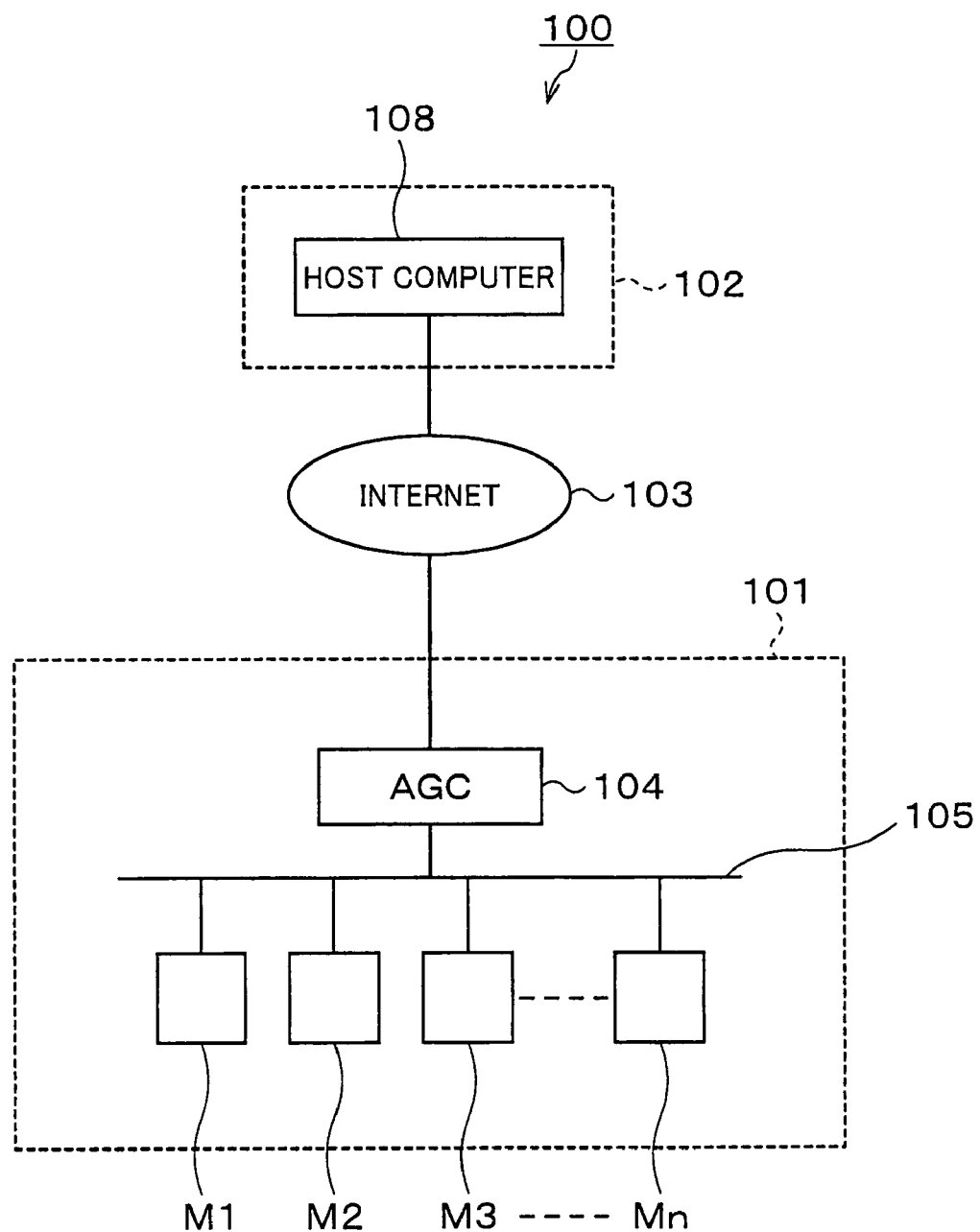
FIG. 9 is an explanatory view showing an outline of a configuration of a communication system.

On the other hand, the part information stored in the storage unit 80 in the above embodiment may be transmitted from a main storage unit on a vendor side. Hereinafter, an example of this case is shown. FIG. 9 is a schematic diagram of a configuration of a communication system 100 enabling communication of various kinds of information between a factory side and a vendor side.

Figure 10:
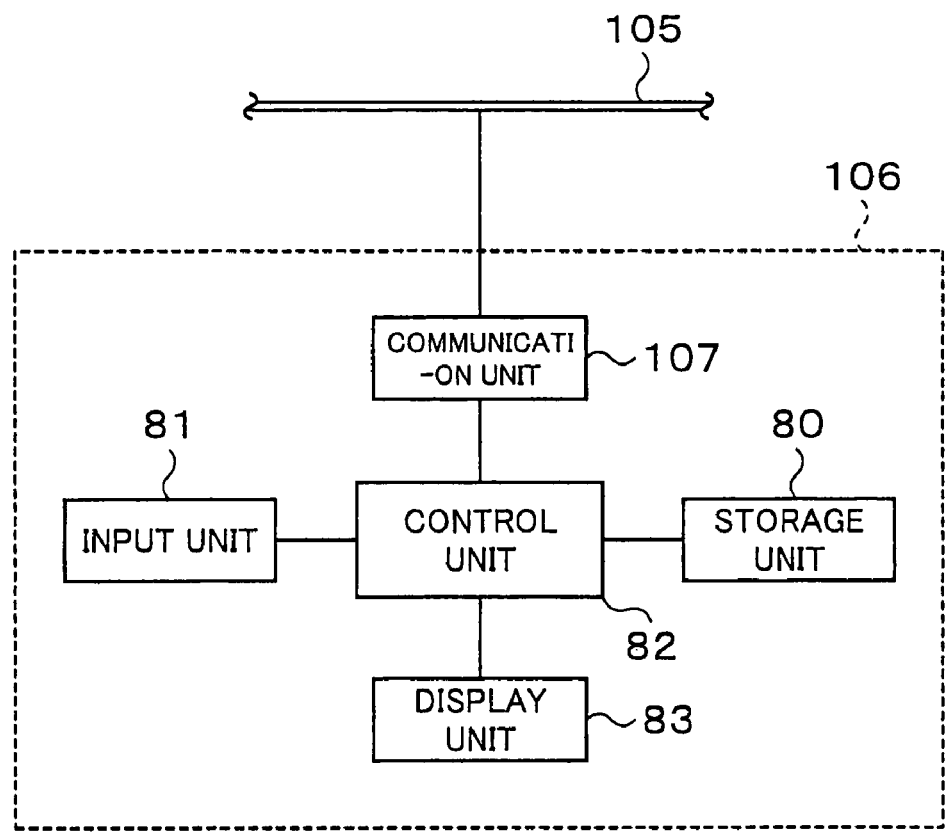
FIG. 10 is an explanatory view showing a configuration example of an order part specifying section.

The communication system 100 is constituted of a factory 101 side where wafer processing is performed and a vendor 102 side of the coating and developing apparatus. The factory 101 side and vendor 102 side are configured to be communicable with each other via the Internet 103. On the factory 101 side, for example, a plurality of coating and developing apparatuses M1 to Mn which are to the same specifications and an AGC 104 (Advanced Group Computer) which collectively manages these coating and developing apparatuses M1 to Mn, are provided. The AGC 104 and coating and developing apparatuses M1 to Mn are connected to a LAN 105 which is constructed on the factory 101 side. In an order part specifying section 106 in the coating and developing apparatus M1, for example, a communication unit for communicating with the AGC 104, that is, a communication unit 107 as a transmitter and a receiver is provided as shown in FIG. 10. Also in the AGC 104, a not-shown communication unit is provided which is connected to the LAN 105 and the Internet 103. It should be noted that configurations of other potions of the order part specifying section 106 are the same as those of the above-described order part specifying section 13 and therefore the descriptions thereof are omitted. Further, configurations of potions of the coating and developing apparatus M1 other than the order part specifying section 106 are also the same as those of the above-described coating and developing apparatus 1.

Figure 11:
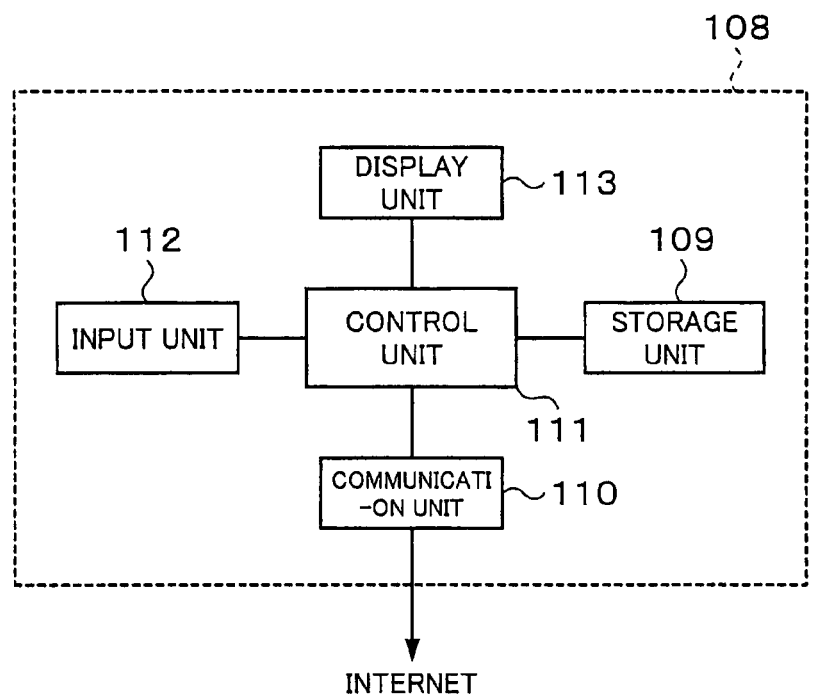
FIG. 11 is a block diagram showing a configuration of a host computer.

On the other hand, on the vendor 102 side, a host computer 108 is provided as shown in FIG. 9. The host computer 108 is constituted of, for example, a storage unit 109 as a main storage unit, a communication unit 110, a control unit 111, an input unit 112, a display unit 113, and so on as shown in FIG. 11.

The storage unit 109 is constituted of, for example, a RAM or the like, in which part information on each of the component parts of the coating and developing apparatuses M1 to Mn is accumulated. The part information includes the latest stock information and so on in addition to the part name, the part number, and the parts supplier necessary, for example, when placing an order for a part.

The communication unit 110 is connected to the Internet 103 to be able to transmit the part information stored in the storage unit 109 to the coating and developing apparatuses M1 to Mn via the Internet 103 and through the AGC 104.

In the communication system 100 configured as above, the part information is periodically transmitted, for example, from the host computer 108 on the vendor 102 side to the coating and developing apparatuses M1 to Mn. Then, the part information received by the coating and developing apparatuses M1 to Mn is sent to the storage units 80 so that the part information in the storage units 80 is updated. This allows the apparatus manager on the factory 101 side to always obtain new part information. Consequently, the apparatus manager can place an order for a part based on the latest stock information. Further, even when the parts supplier has been changed, the apparatus manager can immediately obtain this information.

The part information is stored in the storage unit 80 of the coating and developing apparatus so that the part information on a broken part is read from the storage unit 80 in the above embodiment, but the information may be read from the storage unit 109 in the host computer 108 on the vendor 102 side through use of the aforementioned communication system 100. In this case, it is necessary that the part information on each component part is stored, in correspondence with the barcode of each component part, in the storage unit 109.

In specifying a part to be ordered, when the apparatus manager inputs the barcode of a broken component part, for example, in the coating and developing apparatus M1, information of the barcode as an identification mark is transmitted to the host computer 108 via the Internet 103. When the host computer 108 receives the information of the barcode, part information corresponding to the barcode is read from the storage unit 109 and transmitted from the communication unit 110 to the coating and developing apparatus M1. The part information received by the coating and developing apparatus M1 is displayed on the display unit 83 as a part information screen P as in the above-described example. This allows the apparatus manager to obtain accurate part information on a part to be ordered. In this case, the part information on the side of the vendor 102 that manufactured the coating and developing apparatus can be obtained, and therefore later and more detailed part information can be obtained.

A part to be ordered is specified based on its identification mark in the above embodiment, but may be specified based on characteristics or the like of the component part.

Figure 12:
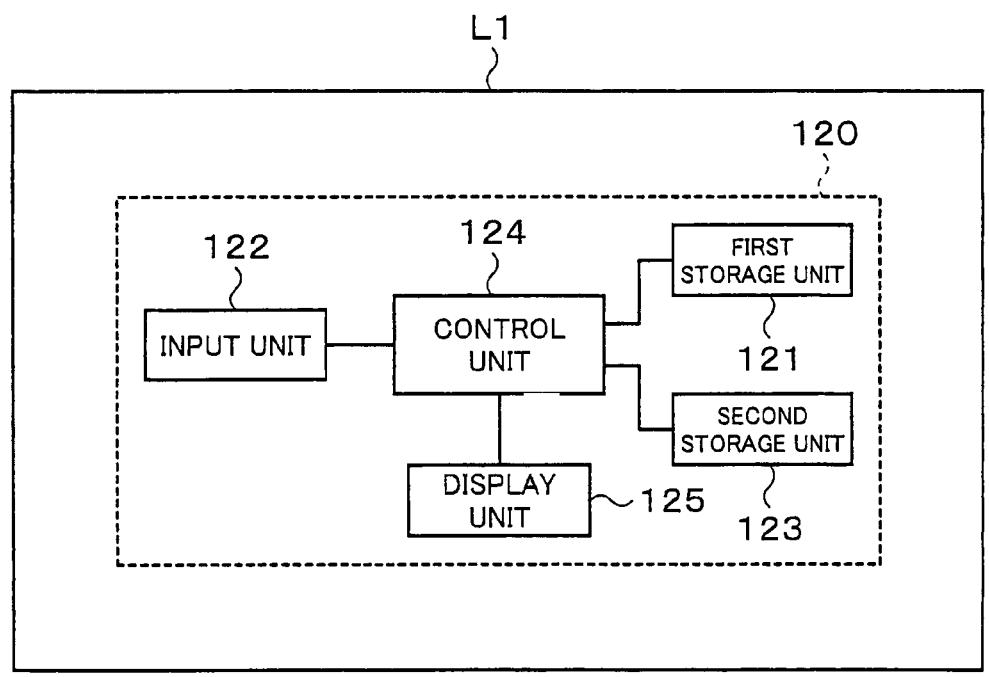
FIG. 12 is an explanatory view showing a configuration example of an order part specifying section.

To implement the example, for example, an order part specifying section 120 of a coating and developing apparatus L1 is constituted of, for example, a first storage unit 121, an input unit 122, a second storage unit 123, a control unit 124, a display unit 125, and so on as shown in FIG. 12.

The first storage unit 121 stores part information on each component part of the coating and developing apparatus L1, image information on each component part, and specification information used for specifying each component part, in correspondence with each component part. The specification information includes, for example, the generic name for a component part, the dimensions of standardized portions of the component part, the unit name in use, and so on, for example, "nozzle," "bore diameter 2 mm," "resist coating unit," and so on in the case of the resist solution discharge nozzle 70.

The input unit 122 is constituted of, for example, a keyboard or the like provided with cursor keys, number keys, and so on through which the apparatus manager can input the specification information for a broken component part.

In the second storage unit 123, a search program or the like is stored which searches a component part matching with the specification information inputted from the input unit 122, from among, for example, the component parts in the first storage unit 121. Besides, the control unit 124 includes, for example, a CPU or the like and executes the above search program and so on. It should be noted that a search unit in this embodiment is constituted of the first storage unit 121, second storage unit 123, and control unit 124.

The display unit 125 is constituted, for example, of a dot matrix-type color liquid crystal display cell or CRT. On the display unit 125, for example, a component part list screen Q shown in FIG. 13 displaying in a list form component parts searched by the above search program, an image display screen R shown in FIG. 14 displaying image information on a component part selected from the component part list, and the part information screen P shown in FIG. 8 displaying the part information on a component part which is finally selected by the apparatus manager, are displayed. In the component part list screen Q, the part names and part numbers of component parts are displayed. It should be noted that component part candidate information of the present invention includes the part name and the part number of a component part and the image information in this embodiment.

Figure 13:
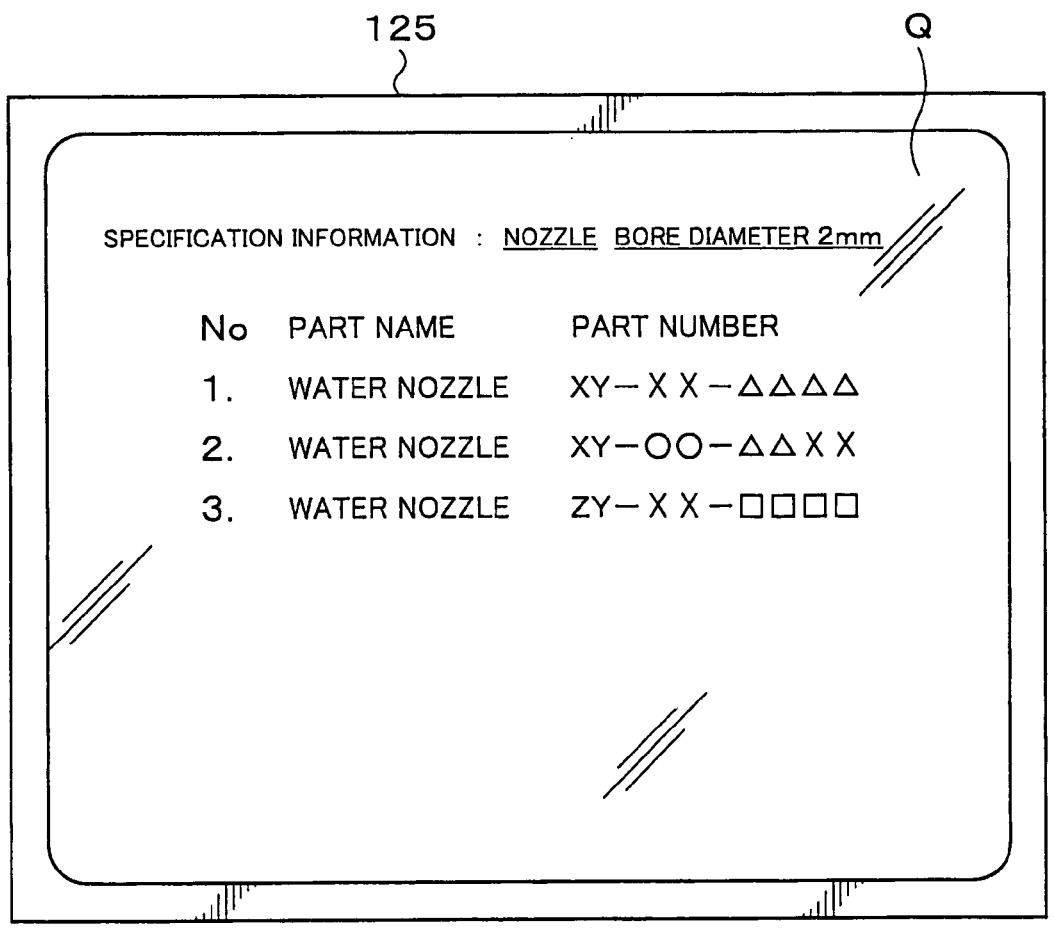
FIG. 13 is an explanatory view showing a display example of a component part list screen.

An order part specifying process in the coating and developing apparatus L1 having the above configuration is described with as an example of a case in which the resist solution discharge nozzle 70 is broken. First, the apparatus manager inputs the specification information for the resist solution discharge nozzle 70 into the input unit 122. The specification information in this event should be, for example, "nozzle," "bore diameter 2 mm." Next, the search program being executed, component parts, which match with the specification information, are searched from among the component parts stored in the first storage unit 121, and the component part list screen Q shown in FIG. 13 is displayed on the display unit 125.

Figure 14:
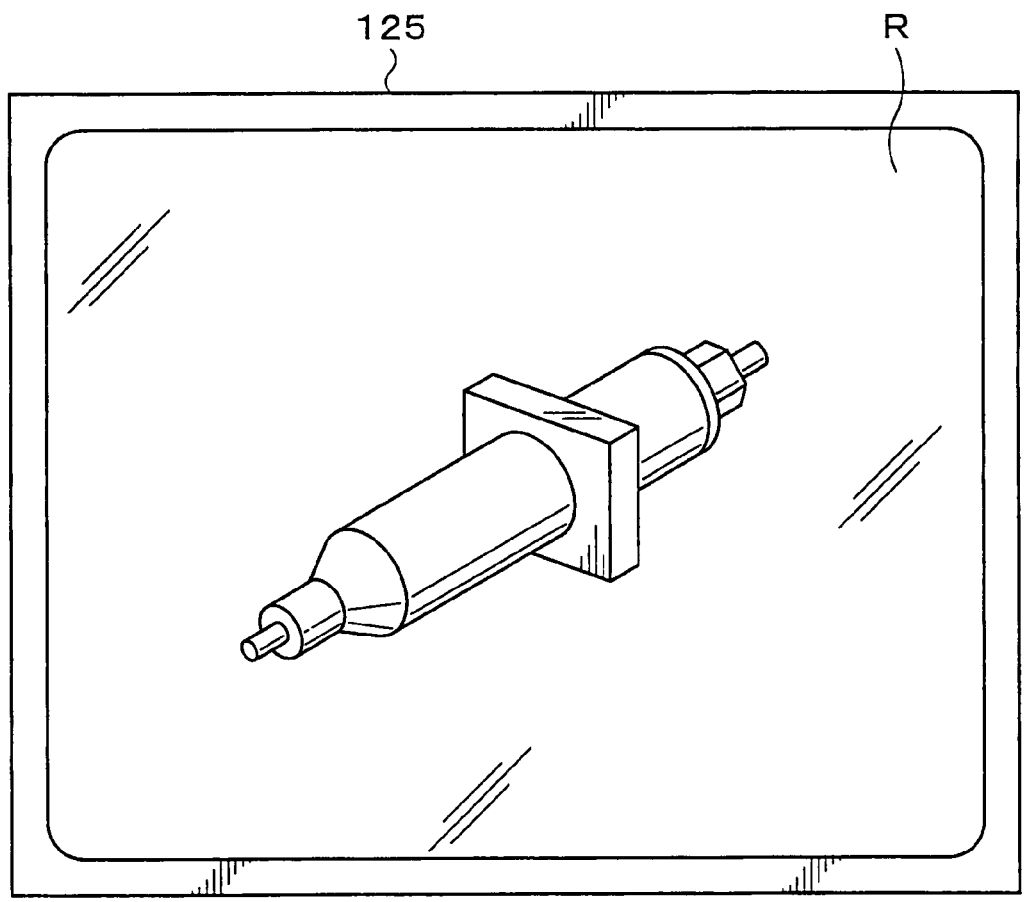
FIG. 14 is an explanatory view showing a display example of an image display screen.

When the apparatus manager selects an appropriate component part, for example, in the component part list and inputs the number of the component part into the input unit 122, the image display screen R displaying the image of the component part is displayed on the display unit 125 (FIG. 14). The apparatus manager specifies a component part of the same kind as that of the broken component part by inspecting the images of the component parts listed in the component part list as described above. After the component part is specified, the part information screen P displaying the part information on the part is displayed on the display unit 125 (shown in FIG. 8). The apparatus manager places an order for a replacement part based on the part information displayed in the part information screen P.

According to this embodiment, it is possible to specify a part to be ordered based on characteristics of a broken component part without attaching an identification mark to the component part in advance, and obtain its part information.

It should be noted that the image of the component part in the above embodiment may be an image showing the component part as seen from a plurality of directions or a moving image by which the entire configuration of the component part can be confirmed.

The part to be ordered is specified based on the specification information for the broken component part in the above embodiment, but may be specified based on image pickup information on the broken component part.

Figure 15:
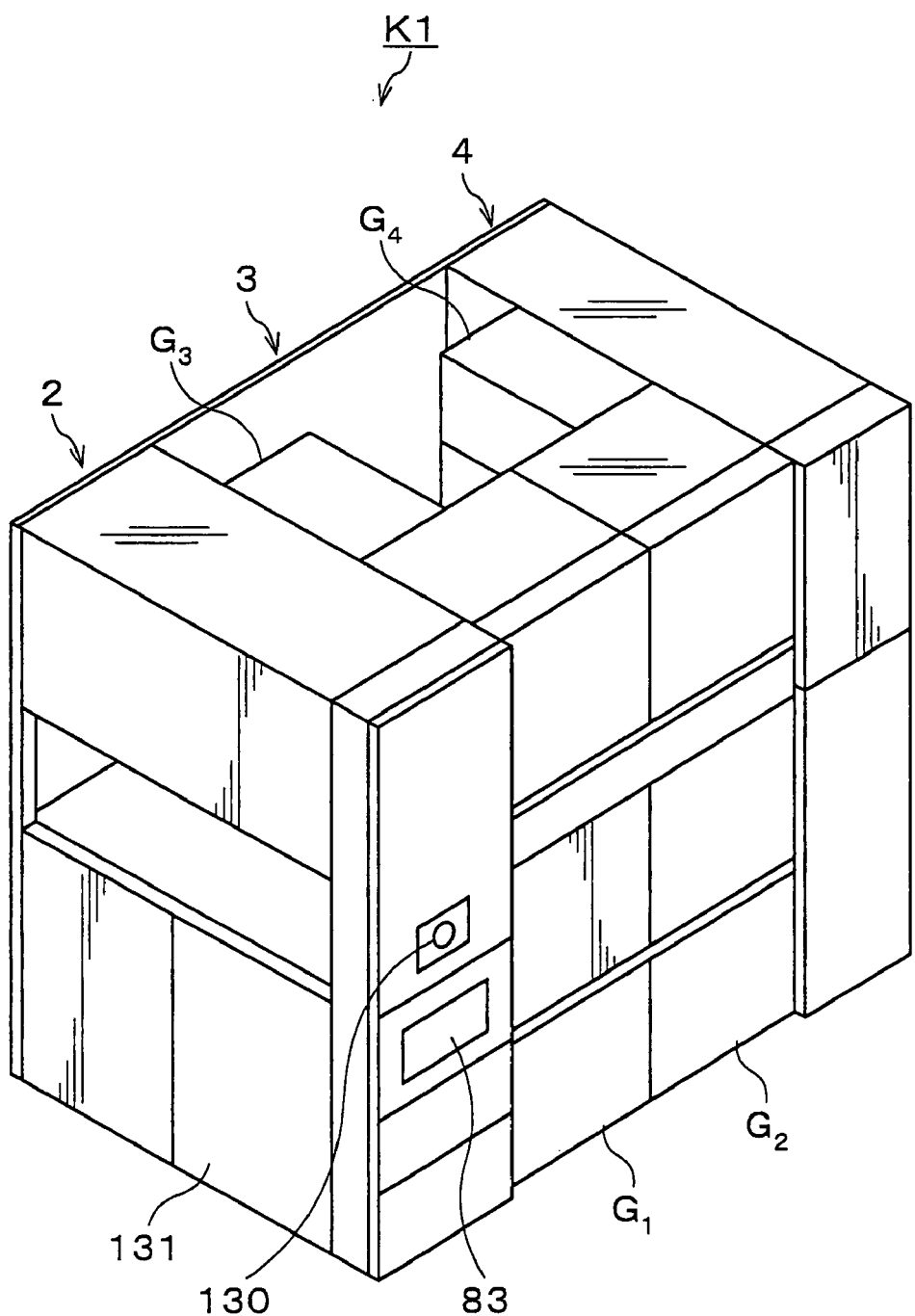
FIG. 15 is a perspective view showing an outline of a configuration of a coating and developing apparatus in a case in which a CCD camera is attached thereto.

In this case, for example, a CCD camera 130, as an image pickup unit for picking up an image of the broken component part, is provided on the front side of a coating and developing apparatus K1 as shown in FIG. 15. The image pickup information on the image picked up by the CCD camera 130 can be sent, for example, to an order part specifying section 131. It should be noted that the order part specifying section 131 has the same configuration as that of the above-described order part specifying section 106.

Figure 16:
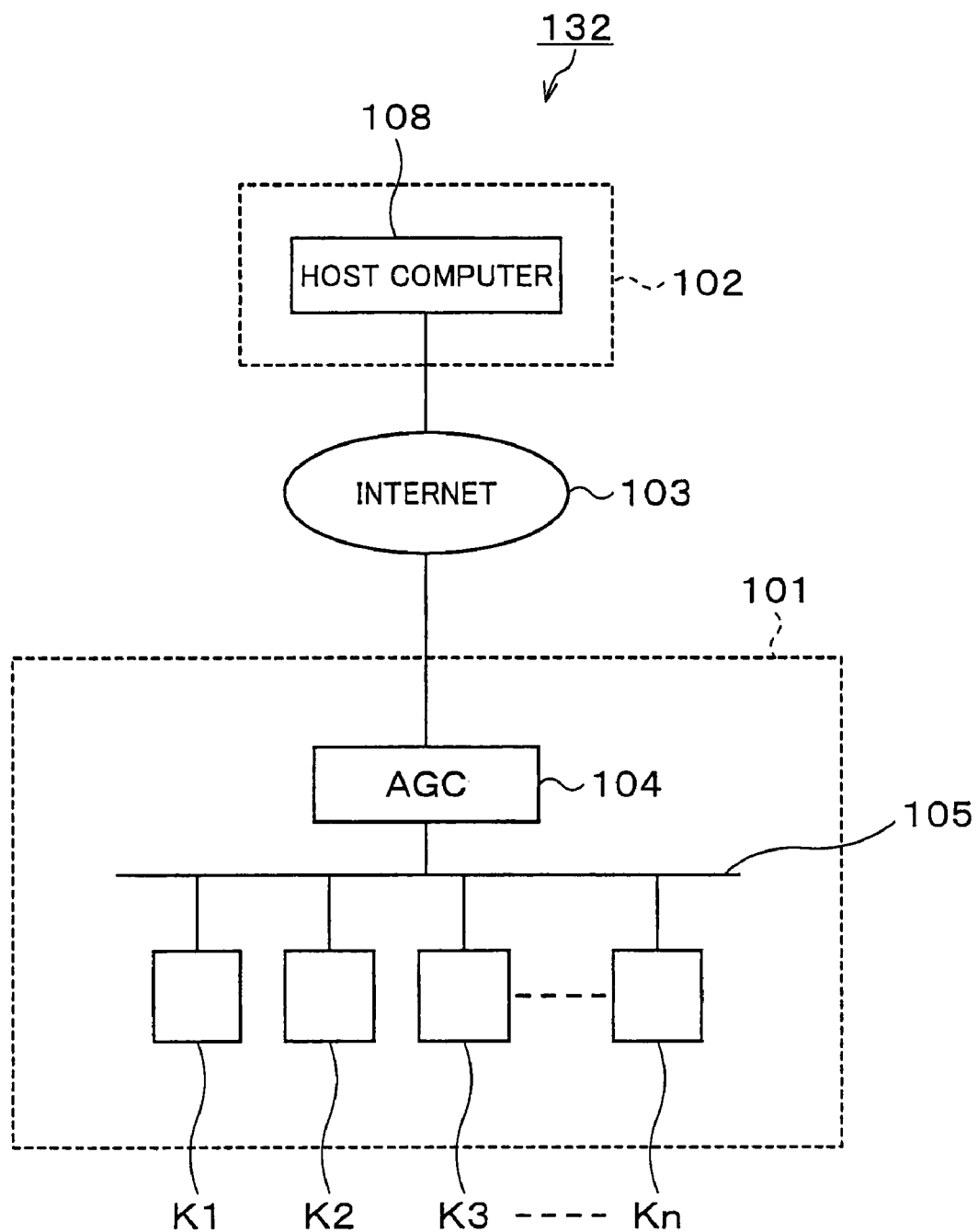
FIG. 16 is an explanatory view showing a configuration of a transmission system for transmitting image information.

The coating and developing apparatus K1 constitutes a communication system 132, as shown in FIG. 16, which is the same as the above-described communication system 100, and therefore can transmit the above image pickup information from the order part specifying section 131 to the host computer 108 on the vendor 102 side. Further, component part candidate information assumed from the above image pickup information can be transmitted from the host computer 108 to the coating and developing apparatus K1.

In specifying a part to be ordered in the coating and developing apparatus K1 configured as above, first the apparatus manager holds a broken component part in front of the CCD camera 130 to pick up an image of the component part by the CCD camera 130. This image pickup information on the component part is transmitted, for example, from the communication unit 107 via the AGC 104 to the host computer 108 on the vendor 102 side. The image pickup information transmitted to the host computer 108 is displayed, for example, on the display unit 113 of the host computer 108 so as to be notified to a person in charge on the vendor 102 side. The person in charge on the vendor 102 side lists up parts which are assumed to be the same as the broken component part based on the image pickup information displayed on the display unit 113, and transmits information on the parts, as the component part candidate information, to the coating and developing apparatus K1 side. The component part candidate information includes, for example, the part name, the image information on the part, and so on.

The component part candidate information received by the coating and developing apparatus K1 is graphically displayed in a catalogue form for each part, for example, on the display unit 83 so that the apparatus manager specifies a part to be ordered from among them. Then, the detailed part information stored in the storage unit 80 is read based on the specified part name so that an order for the part is placed.

According to this embodiment, since the part to be ordered is specified based on the image pickup information on the broken component part, the part to be ordered can be specified even if there is no clue on the component part such as the identification mark, characteristics, or the like, unlike the above-described embodiment. Further, since the person in charge on the vendor side who is an expert lists up component part candidates so that the part to be ordered can be specified from among the component part candidates, the part to be ordered can be quickly specified from among more qualified candidates. Further, since the image information is included in the component part candidate information, the apparatus manager can easily specify the part to be ordered.

It should be noted that in the above embodiment, if the person in charge on the vendor 102 side can immediately specify the component part based on the image pickup information, the person in charge on the vendor 102 may directly transmit the part information on the component part accumulated in the vendor side 102. In this case, the person in charge on the vendor 102 side may transmit both the above-described component part candidate information and the part information. Instead directly transmitting the specified part information, the vendor 102 side may transmit only the result of specifying the component part (specification information), for example, identification information for the specified component part. In this case, it is also adoptable, for example, to call part information from the storage unit 80 based on the received identification information and display the part information on the display unit 83 in the coating and developing apparatus M1.

Figure 17:
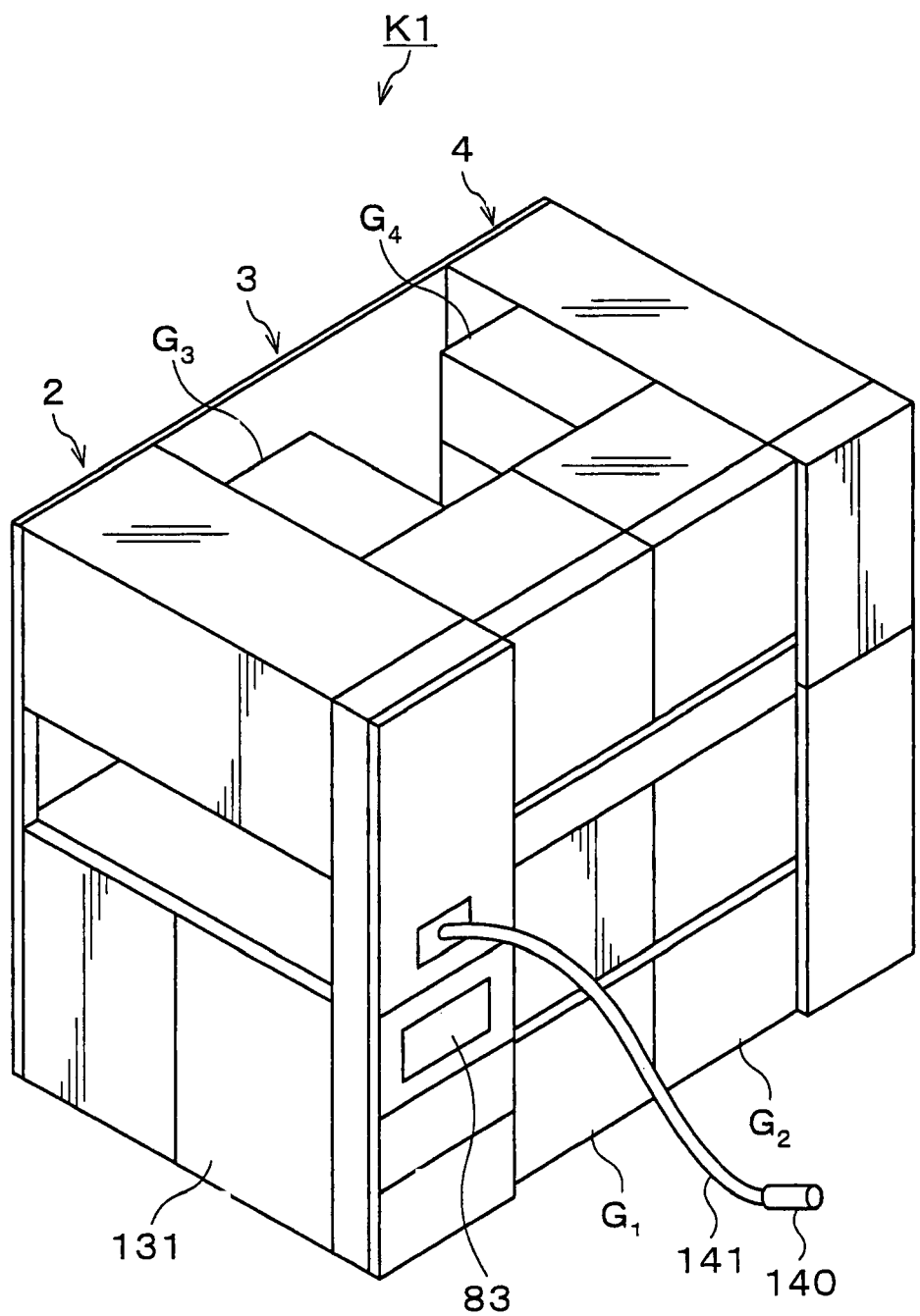
FIG. 17 is a perspective view showing an outline of a configuration of a coating and developing apparatus in a case in which a movable CCD camera is attached thereto.

The CCD camera 130 may be movable. FIG. 17 shows an example of this case, in which a cord 141 which is freely windable and having a predetermined length is attached to a CCD camera 140. Thereby, even when a component part which is difficult to carry is broken, the image of the broken part can be picked up by moving the CCD camera 140. It should be noted that it is not always necessary to establish connection using the cord 141, but a radio transmitter may be attached to the CCD camera so as to wirelessly transmit the image pickup information to the coating and developing apparatus K1. Alternatively, a memory for storing the image pickup information is provided in an information storage medium in a CCD camera, so that the image pickup information may be provided by the information storage medium to the coating and developing apparatus K1.

Figure 18:
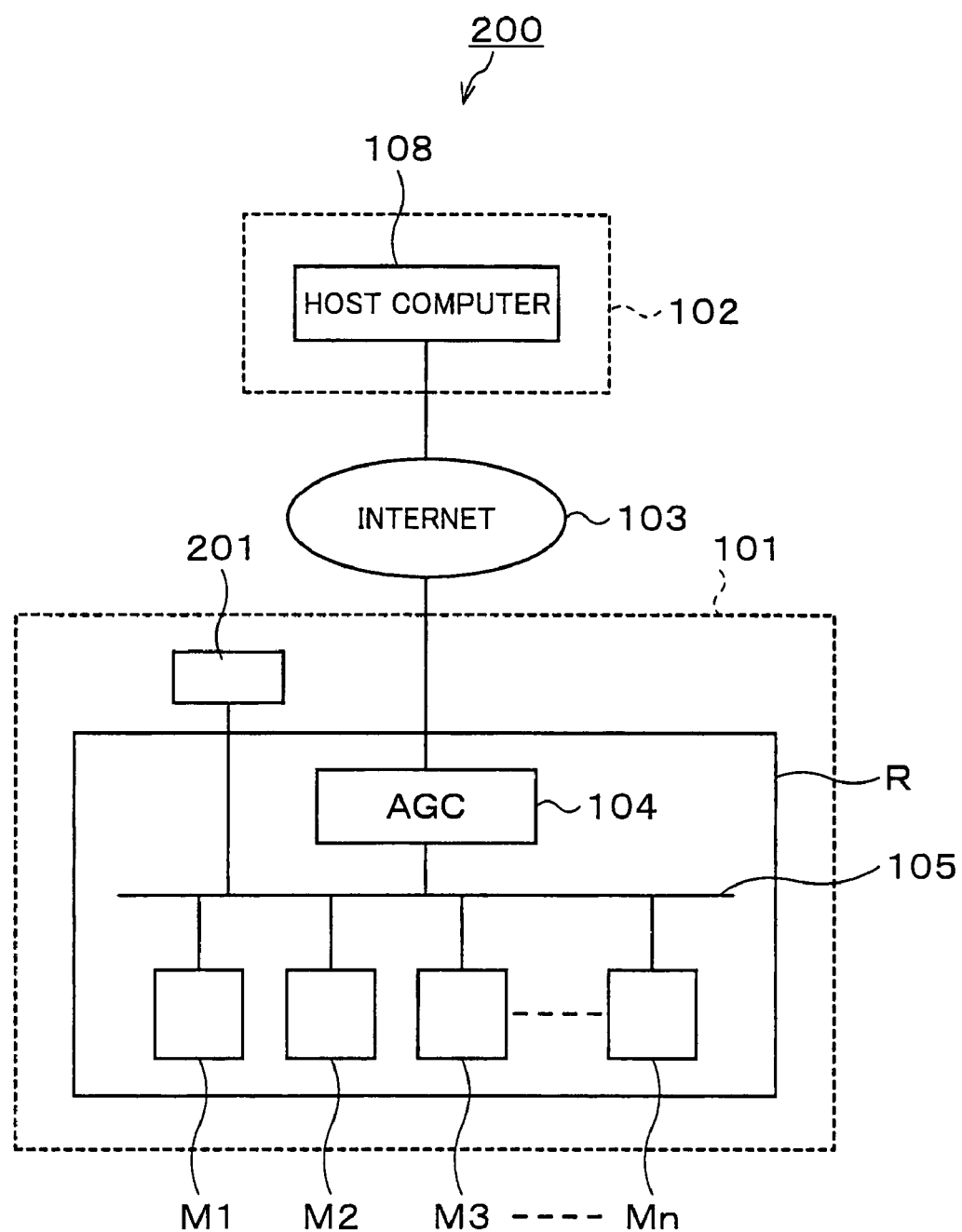
FIG. 18 is a schematic block diagram of an arm position adjusting system according to another embodiment.

Next, another embodiment will be explained. FIG. 18 is a schematic block diagram of an arm position adjusting system as a carrier adjusting system according to another embodiment. This arm position adjusting system 200 is a system for adjusting a stop position at a destination of a carrier arm provided inside a coating and developing apparatus which will be described later.

The arm position adjusting system 200 has a plurality of coating and developing apparatuses M1 to Mn, an AGC 104, and an administrative computer 201 on a side of a factory 101 of a wafer maker, for example, and it has a host computer 108 on a side of a vender 102 of an apparatus maker. The coating and developing apparatuses M1 to Mn and the AGC 104 are placed inside a clean room R in the factory 101, and the administrative computer 201 is placed outside the clean room R in the factory 101.

As described in the above embodiment, the AGC 104 on the side of the factory 101 and the host computer 108 on the side of the vender 102 are connected by Internet 103, and they can communicate information to each other. Fire walls not shown are provided at the side of the factory 101 and at the side of the vender 102 of the Internet 103, respectively, and protect respective terminals. The plurality of coating and developing apparatuses M1 to Mn, the AGC 104 and the administrative computer 201 on the side of the factory 101 are connected to, for example, a LAN 105 constructed inside the factory 101, and they can communicate information to one another.

Figure 19:
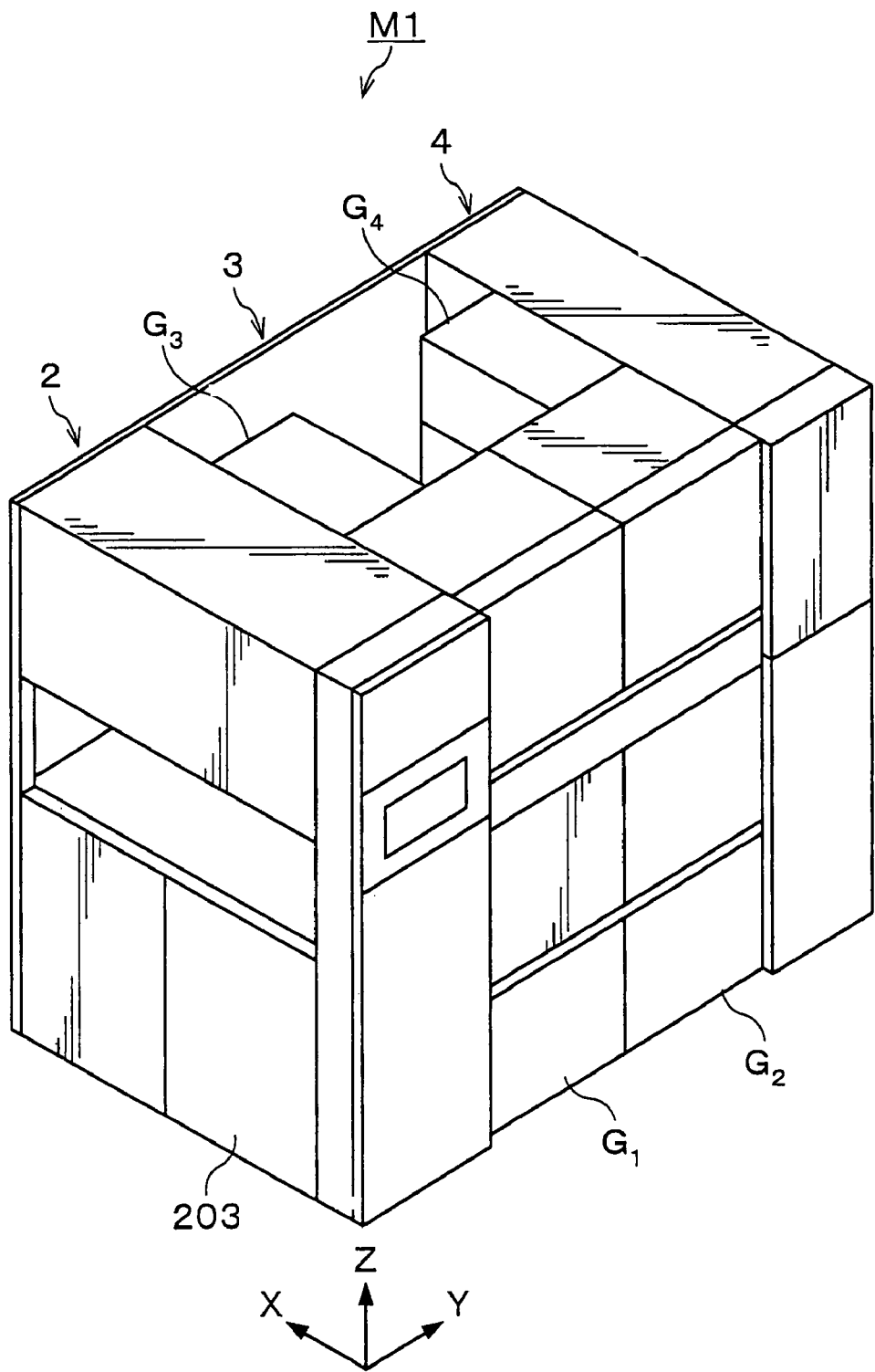
FIG. 19 is a perspective view showing an outline of a coating and developing apparatus for constituting an arm position adjusting system.

The configuration of the coating and developing apparatuses M1 to Mn is the same as that of the above-described embodiment. Note that the cassette station 2 is provided with a control section 203, which will be described later, of the coating and developing apparatus 1 as shown in FIG. 19.

Figure 20:
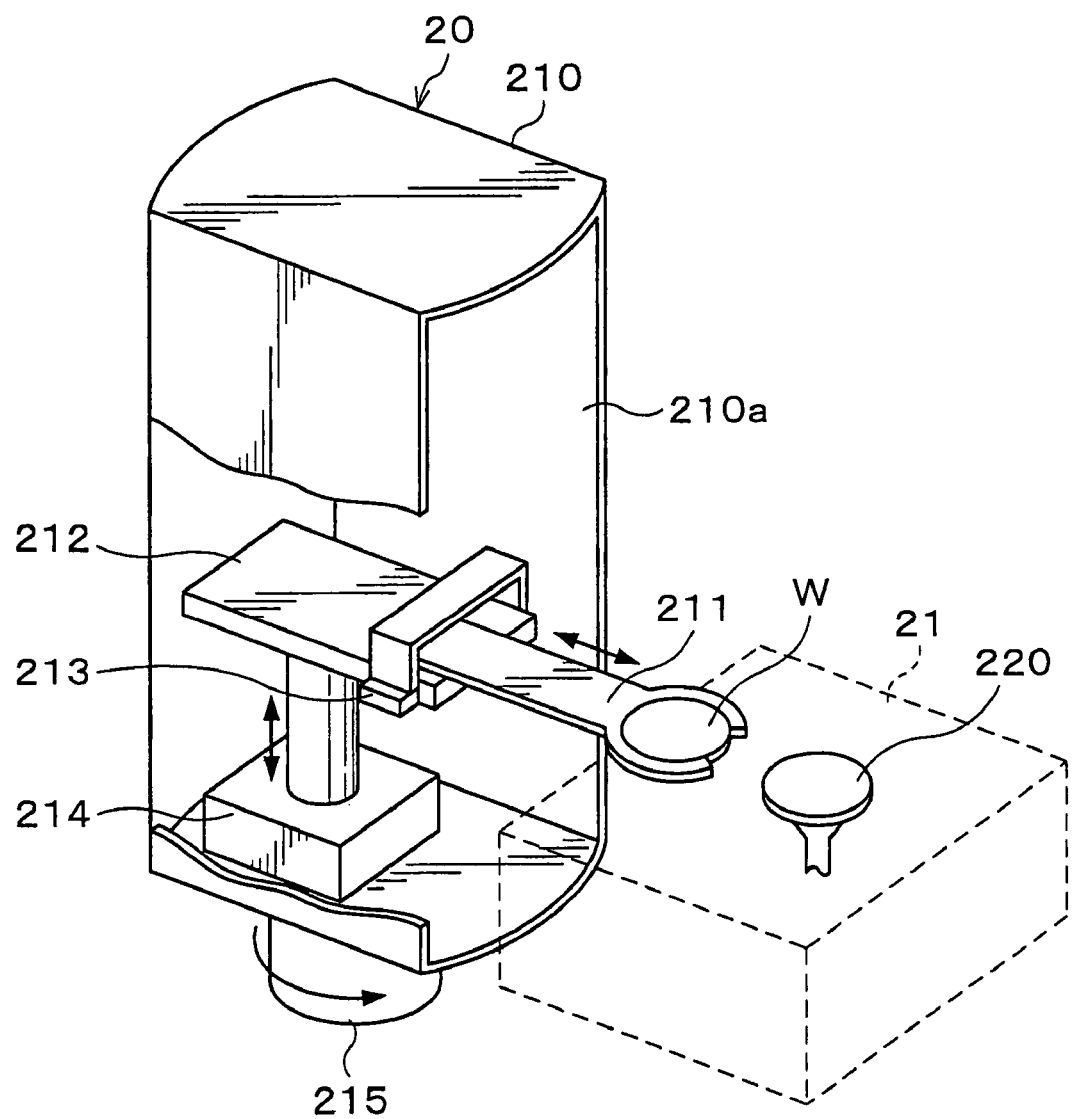
FIG. 20 is a perspective view showing an outline of a configuration of a main carrier unit.

The main carrier unit 20 provided in the processing station 3 has a substantially cylindrical case 210 as shown in, for example, FIG. 20, and has a carrier arm 211 as a carrier inside the case 210. The case 210 has an opening 210a at a side face, so that the carrier arm 211 can come in and go out of the opening 210a. The carrier arm 211 has a tip end formed to be a substantially C-shape in a substantially ¾ ring form, for example, so as to support the wafer W with the C-shaped portion.

The carrier arm 211 is provided on a carrier base 212, so that it can move in a direction of the opening 210a on the carrier base 212 by a first driving part 213 including a motor and the like. The carrier base 212 can be moved in an up-and-down direction by a second driving part 214 including, for example, a cylinder, a driving belt, and the like. As a result, the carrier arm 211 can move in the up-and-down direction. A third driving part 215 including a servo motor and the like which rotate the entire case 210 is provided at a lower portion of the case 210, and the case 210 is rotatable at a predetermined angle. As a result, the carrier arm 211 can change orientation in a predetermined horizontal direction. According to the above configuration, the carrier arm 211 is movable three-dimensionally.

The aforesaid first driving part 213, second driving part 214, and third driving part 215 are controlled by a control device 240 which will be described later of the control section 203, and the carrier arm 211 carries the wafer W, which is an object to be carried, in accordance with a control of the control device 240. Namely, the carrier arm 211 moves to a predetermined stop position inside each processing unit in accordance with a command signal of the control device 240, and delivers the wafer W to each processing unit.

Figure 21:
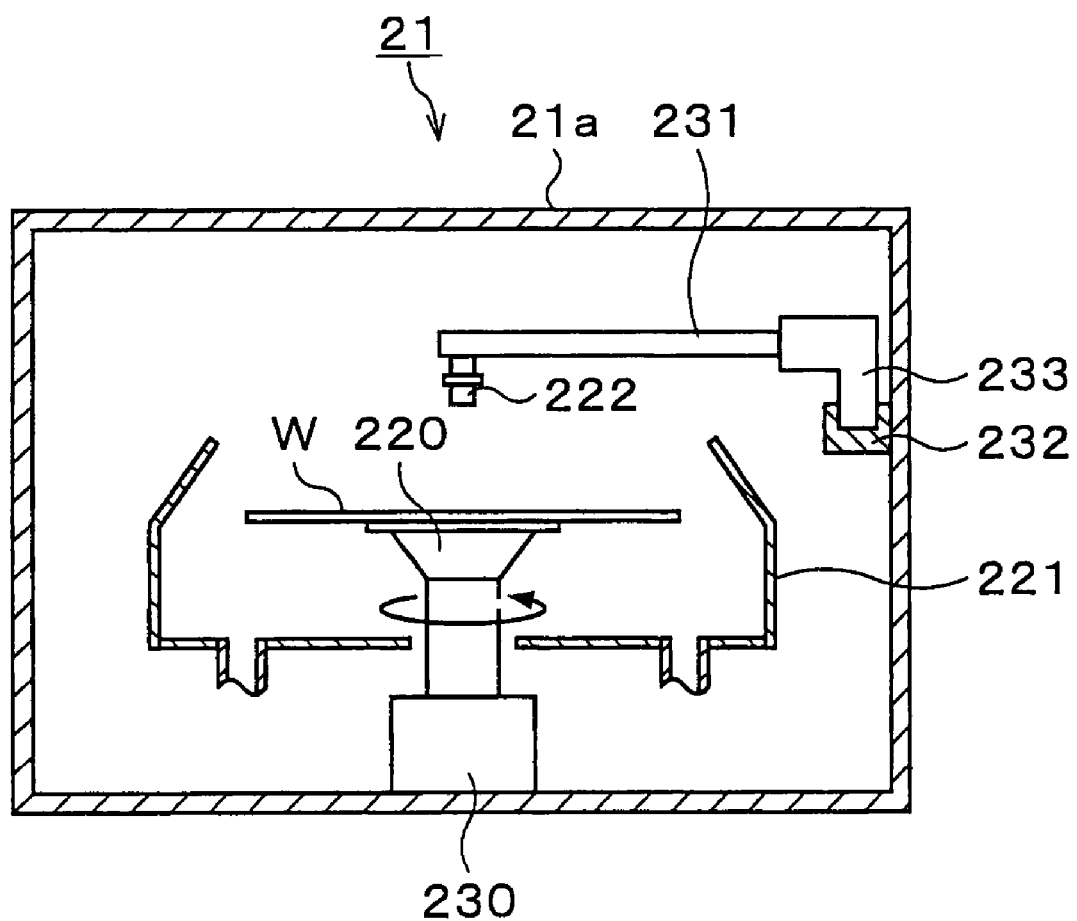
FIG. 21 is an explanatory view in longitudinal section showing an outline of a configuration of a resist coating unit.
Figure 22:
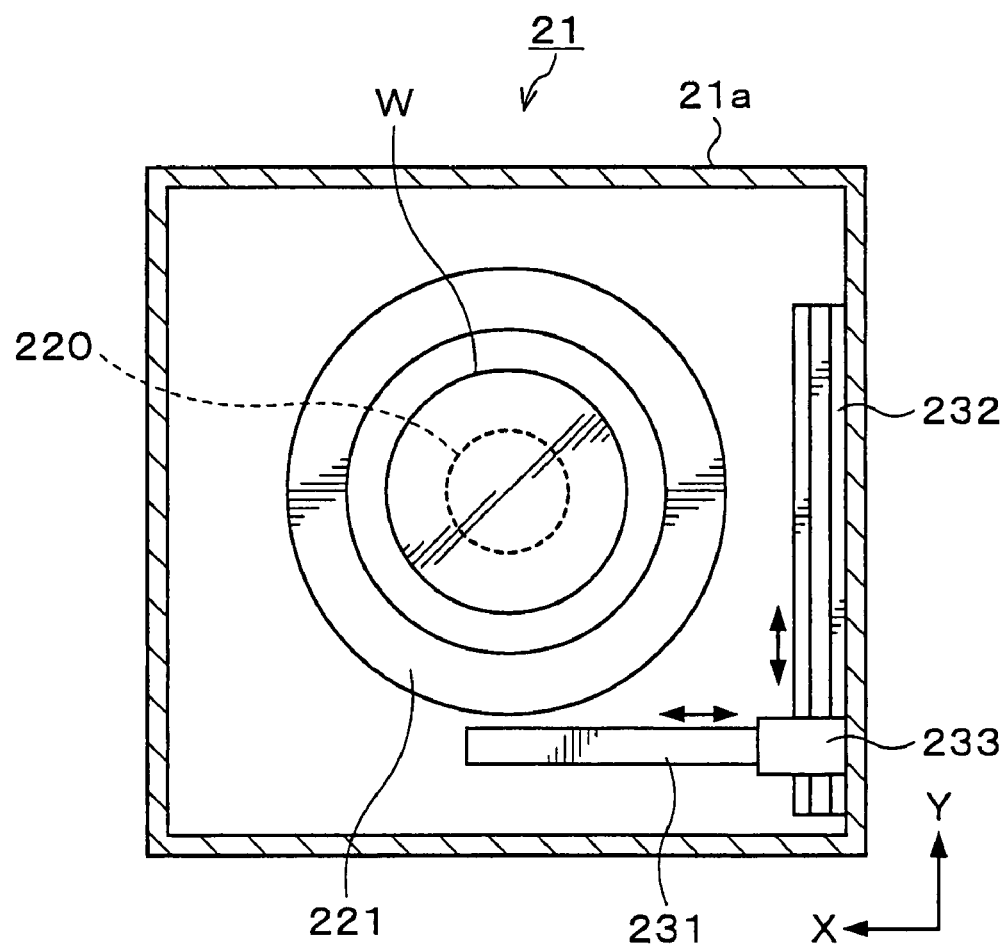
FIG. 22 is an explanatory view in cross section showing the outline of the configuration of the resist coating unit.

Meanwhile, the resist coating unit 21 in the first processing unit group G1 has a casing 21a as shown in, for example, FIG. 21 and FIG. 22, and has a spin chuck 220 for holding the wafer W by suction and rotating it, a substantially cylindrical cup 221 for surrounding an outer side of the wafer W held by the spin chuck 220, and a resist solution discharge nozzle 222 as a treatment solution supplying member for discharging the resist solution to the wafer W, and the like, inside the casing 21a.

Figure 23:
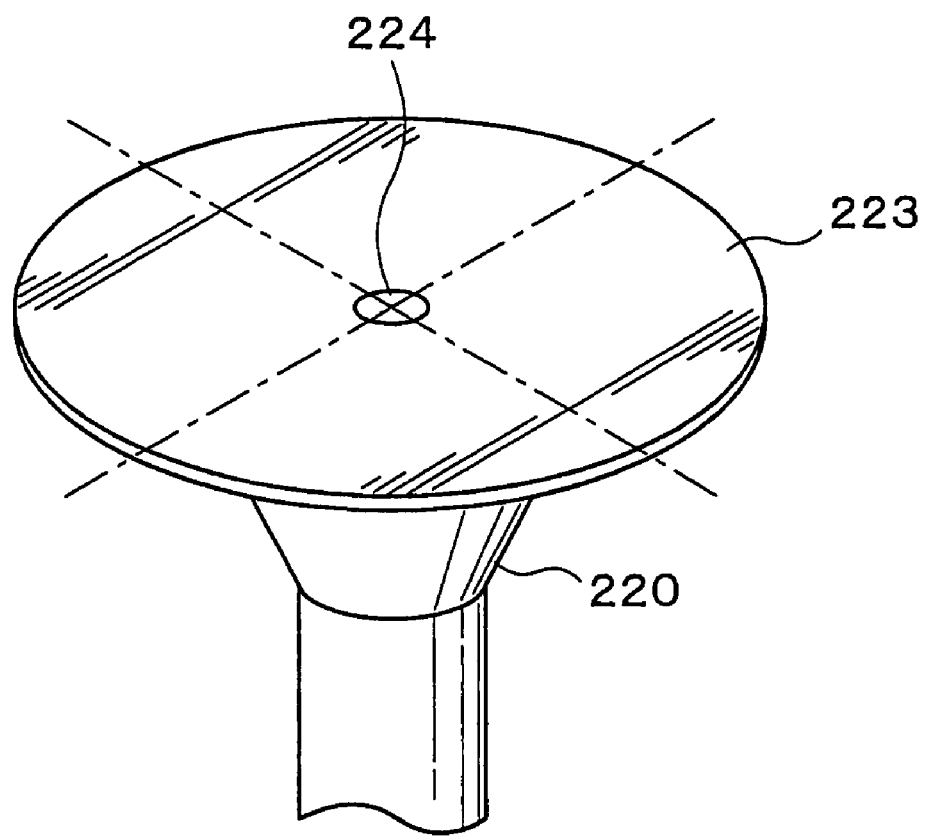
FIG. 23 is a perspective view showing a configuration of a spin chuck.

In the spin chuck 220, a top surface 223 is formed to be horizontal as shown in FIG. 23, and a suction port 224 for sucking the wafer W is provided at a center of the top surface 223. This suction port 224 becomes a reference on the occasion of adjustment of a stop position at the destination of the carrier arm 211. The spin chuck 220 is also provided with a rotation drive part 230 for rotating the spin chuck 220 as shown in FIG. 21.

The resist solution discharge nozzle 222 is held by a nozzle arm 231. The nozzle arm 231 is provided on a rail 232 formed in a Y-direction as shown in FIG. 22, and is movable on the rail 232. The nozzle arm 231 is constituted to be extendible and contractible in the X-direction. The nozzle arm 231 is provided with an arm drive part 233 including a motor, cylinder and the like, which makes it possible to move on the rail 232 and extend and contract in the X-direction. The arm drive part 233 is controlled by, for example, the control device 240 which will be described later, and the nozzle arm 231 carries the resist solution discharge nozzle 222 to a predetermined position on the wafer W.

In the resist coating unit 21 thus constituted, the resist solution is discharged to a center part of the wafer W rotated by the spin chuck 220 from the resist solution discharge nozzle 222, and the resist solution is spread on a top surface of the wafer W, whereby a resist film is formed on the wafer W.

Figure 24:
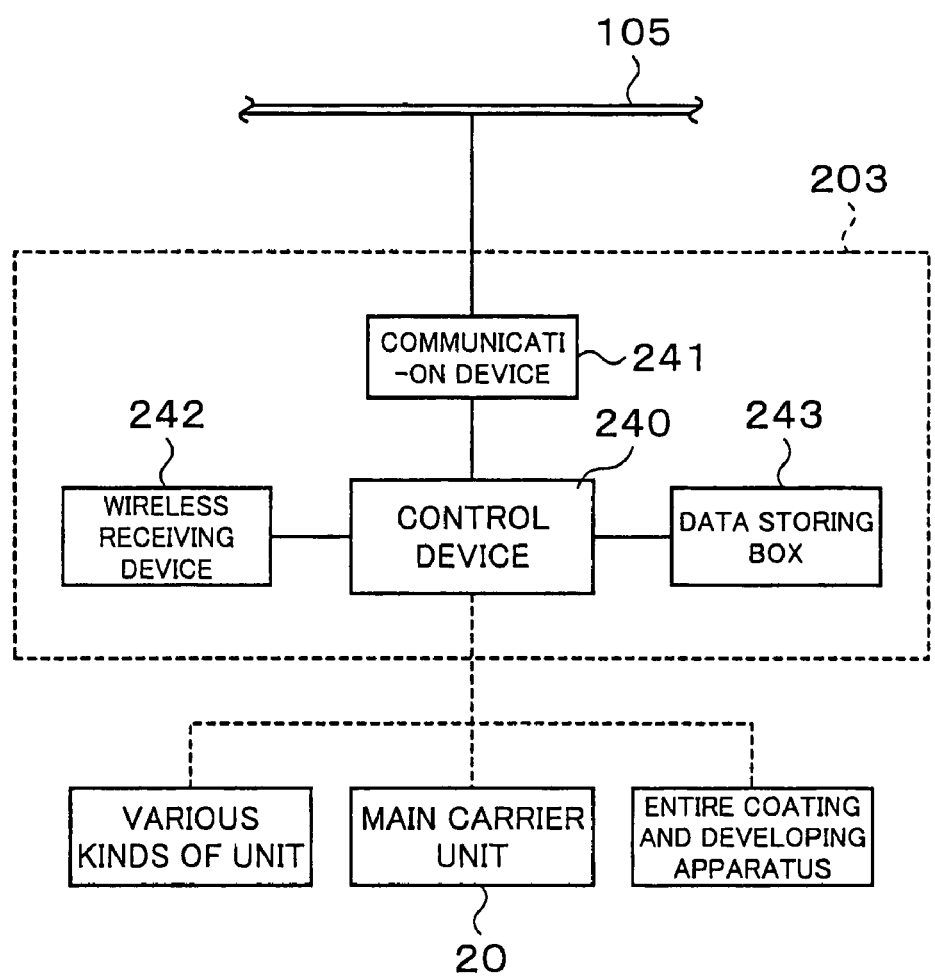
FIG. 24 is a block diagram showing a configuration of a control section.

Next, a configuration of the aforementioned control section 203 will be explained in detail. The control section 203 is constituted of the control device 240, a communication device 241 as a transmitter and a receiver, a wireless receiving device 242, a data storing box 243, and the like, as shown in, for example, FIG. 24.

The control device 240 controls the entire coating and developing apparatus M1, and each of the processing units, carrier units and the like in the coating and developing apparatus M1. The aforementioned main carrier unit 20 is also controlled by the control device 240. Accordingly, the carrier arm 211 of the main carrier unit 20 moves to a predetermined position in each of the processing units by the control of the control device 240, and carries the wafer W to each of the processing units. The control device 240 recognizes a stop position of, for example, the carrier arm 211 of the destination of the wafer W in each of the processing units as three-dimensional coordinates, and the control device 240 moves the carrier arm 211 to set coordinates of the aforesaid stop position of each of the processing units in accordance with a recipe of the wafer processing. The control device 240 can change the set coordinates of the stop position of the aforesaid carrier arm 211 based on information outputted from the communication device 241. Namely, by transmitting correction information to correct the aforesaid set coordinates to the communication device 241 from an outside, the set coordinates of the carrier arm 211 is changed, and the adjustment can be performed.

The wireless receiving device 242 can receive image pickup information as detection information transmitted by radio from a position detecting wafer S which will be described later. The wireless receiving device 242 is connected to the control device 240 via a communication line, and can temporarily output the image pickup information to the control device 240.

The communication device 241 is connected to, for example a LAN 105, and can communicate information with the AGC 104 and the like. The communication device 241 is connected to the control device 240 via a communication line. As a result, the communication device 241 can transmit the image pickup information received at the wireless receiving device 242 to the AGC 104. The communication device 241 can receive various kinds of information from the side of the vender 102 via the AGC 104.

The data storing box 243 is for storing various kinds of information of the control device 240, and for example, the aforesaid image pickup information is stored in the data storing box 243 for a predetermined period.

Figure 25:
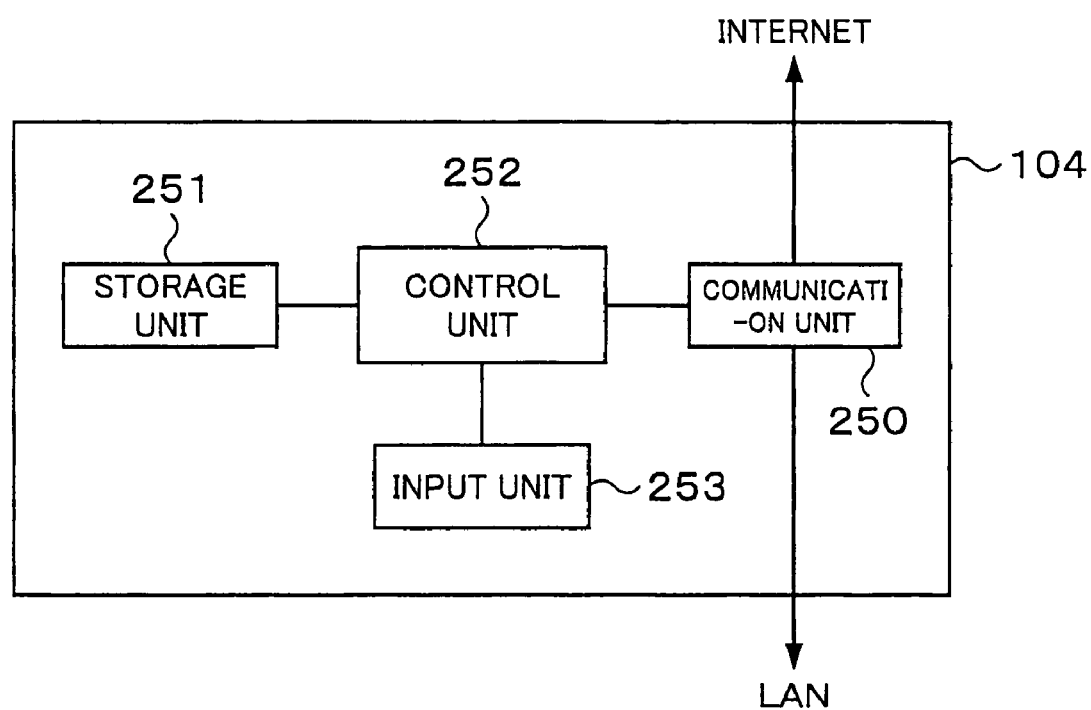
FIG. 25 is an explanatory diagram showing a configuration of an AGC.

Next, a configuration of the AGC 104 will be explained. The AGC 104 is for performing over-all administration of the coating and developing apparatuses M1 to Mn in the factory 101, and communicates with the side of the vender 102 via the Internet 103. The AGC 104 is constituted of a communication unit 250, a storage unit 251, a control unit 252, an input unit 253 and the like, for example, as shown in FIG. 25. For example, the communication unit 250 is constituted of a modem, the storage unit 251 is constituted of a RAM, the control unit 252 is constituted of a CPU, the input unit 253 is constituted of a touch panel and the like.

The communication unit 250 is connected to the LAN 105 and the Internet 103, and can communicate with the coating and developing apparatuses M1 to Mn, the administrative computer 201, and the host computer 108 of the vender 102 and the like. As a result, the aforesaid image pickup information and the like received from the coating and developing apparatus M1 can be transmitted to the host computer 108, while the correction information and the like from the host computer 108 can be transmitted to the coating and developing apparatuses M1 and the like.

The storage unit 251 can store, for example, communicated information. The control unit 252 controls the entire AGC 104, and can execute a program and the like for communication. A set value and the like for collectively administering, for example, the coating and developing apparatuses M1 to Mn can be inputted into the input unit 253.

The administrative computer 201 on the side of the factory 101 is for the person in charge and the like on the side of the factory 101 to administer the coating and developing apparatuses M1 to Mn from an outside of the clean room R, and has the same configuration as an ordinary general purpose PC (Personal Computer), for example.

The host computer 108 as an obtaining device and a providing device on the side of the vender 102 includes the communication unit 110 as described above. The communication unit 110 can communicate predetermined information to the AGC 104, and the AGC 104 can transmit the predetermined information to the communication device 241 of each of the coating and developing apparatuses M1 to Mn. Further, the information received by the communication device 241 can be outputted to the control device 240, and the control device 240 can change the set coordinates of the stop position at the destination of, for example, the carrier arm 211 based on the information. Accordingly, by transmitting the correction information of the set coordinates of the aforementioned carrier arm 211 from the communication unit 110 of the host computer 108, the set coordinates of the carrier arm 211 is changed, and the adjustment can be performed.

The person in charge on the side of the vender 102 can input the aforesaid correction information and the like therein, using the control unit 112 of the host computer 108.

The display unit 113 of the host computer 108 displays the image pickup information and the like obtained by the host computer 108 and can notify them to the person in charge on the side of the vender 102.

Figure 26:
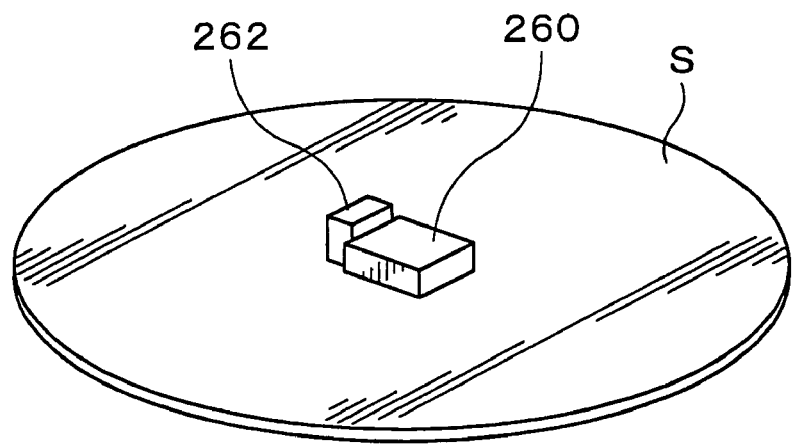
FIG. 26 is a perspective view showing a configuration of a position detecting wafer.
Figure 27:
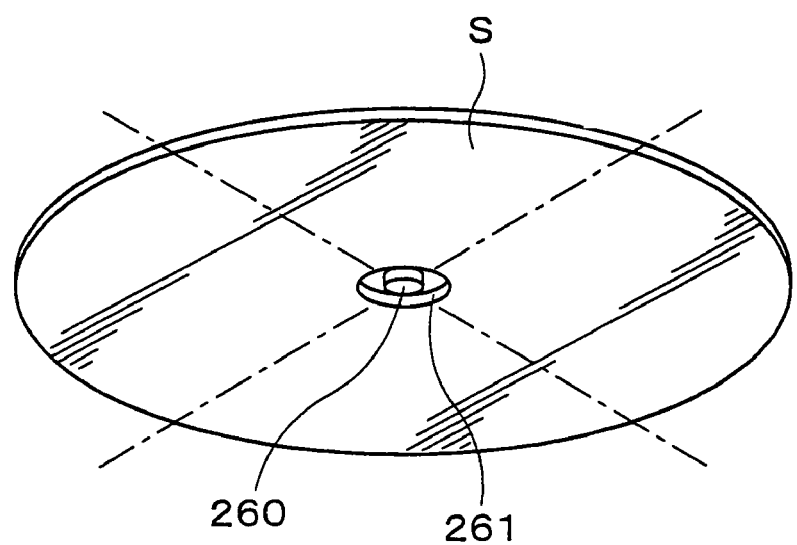
FIG. 27 is a perspective view when the position detecting wafer is seen from a back face side.

It is necessary to detect an actual stop position of the carrier arm 211 in order to adjust the stop position at the destination of the carrier arm 211. For detection of such a stop position, the position detecting wafer S as the detecting substrate as shown in FIG. 26 is used. The position detecting wafer S is formed in the same shape as the wafer W, for example, and can be supported by the carrier arm 211. A CCD camera 260 as a detecting device and an image pickup device is provided on the position detecting wafer S. A hole 261 for image pickup is provided at a center portion of, for example, the position detecting wafer S as shown in FIG. 27. The CCD camera 260 is provided to face downward so that a position of a lens corresponds to the hole 261. As a result, the CCD camera 260 can pick up an image in a downward direction from the center portion of the position detecting wafer S. Accordingly, when the position detecting wafer S supported on the carrier arm 211 is carried into the resist coating unit 21, for example, and the carrier arm 211 stops above the spin chuck 220, which is the destination of the carrier arm 211, the image of the spin chuck 220 can be picked up, whereby the position at which the carrier arm 211 stops can be known.

The CCD camera 260 is provided with a wireless transmitter 262 for transmitting the image pickup information by radio as shown in, for example, FIG. 26. As a result, the image pickup information can be transmitted to the wireless receiving device 242 of the control section 203.

Figure 28:
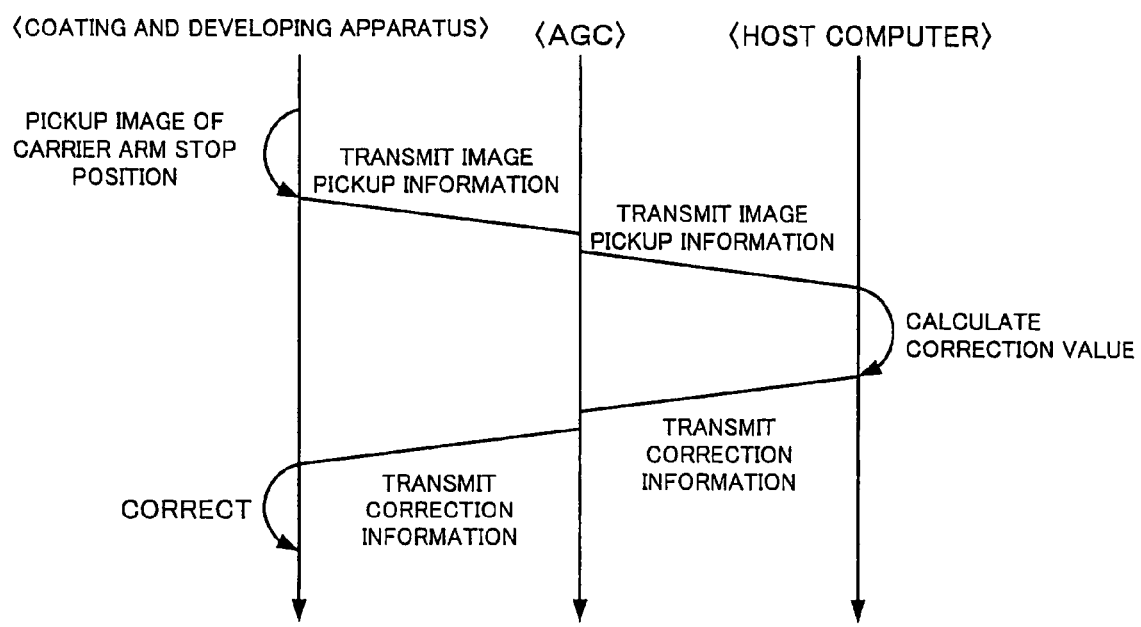
FIG. 28 is a protocol flow of an arm position adjusting system.

An operation of the arm position adjusting system 200 constituted as above will be explained by taking the adjustment of the stop position of the carrier arm 211 in the resist coating unit 21 as an example. FIG. 28 is a protocol flow showing a process of such stop position adjustment.

Figure 29:
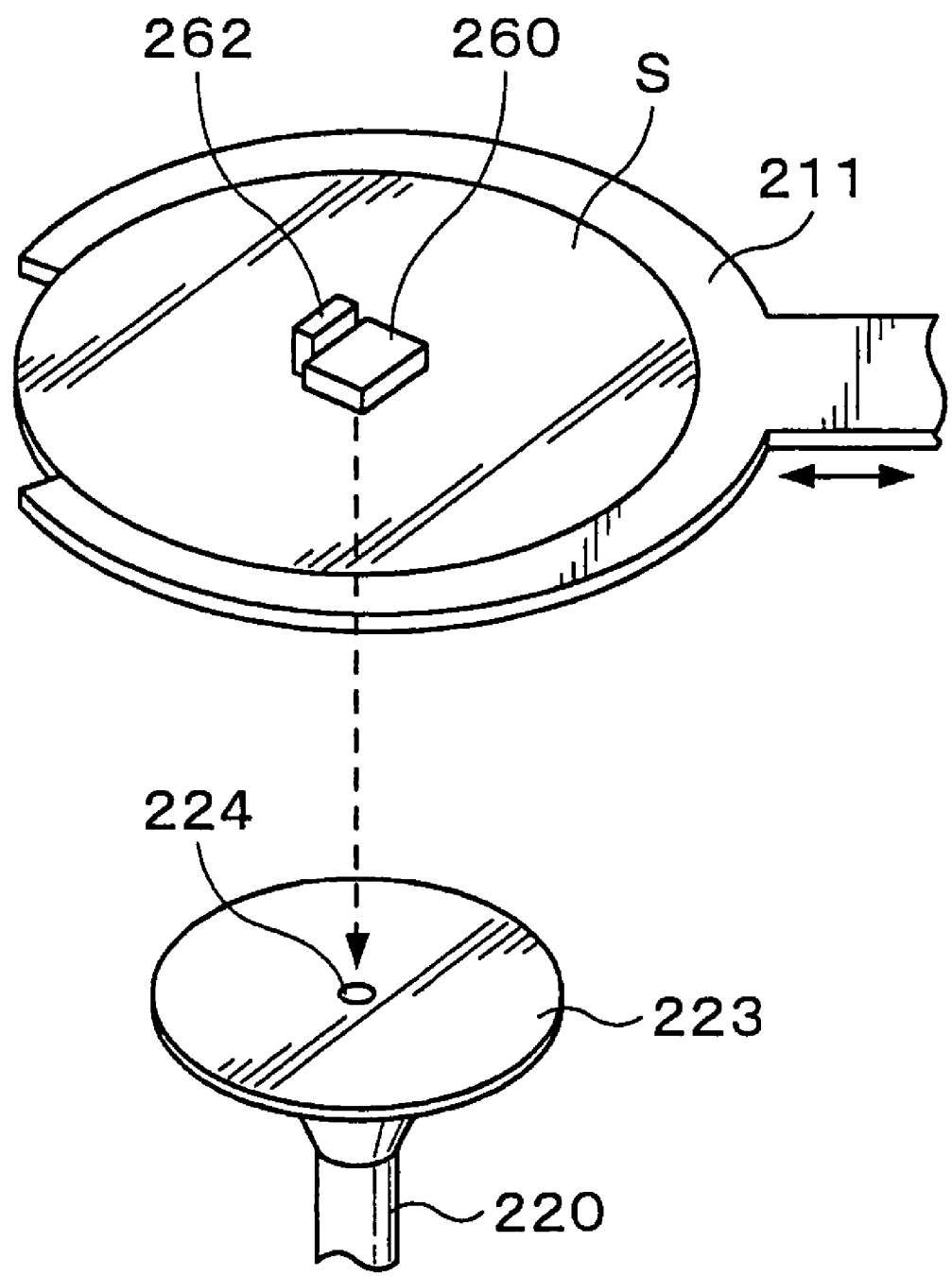
FIG. 29 is an explanatory view showing a position at a destination of a carrier arm in the resist coating unit.

First, an operator on the side of the factory 101 makes the carrier arm 211 support the position detecting wafer S. Next, the operator operates the main carrier unit 20 to move the carrier arm 211 to set coordinates being a stop position inside the resist coating unit 21, for example, set coordinates P1 (X1, Y1, Z1) by the control device 240. The set coordinates P1 (X1, Y1, Z1) are above the spin chuck 220, for example, as shown in FIG. 29, and are originally at a position which is set so that a center of the position detecting wafer S of the carrier arm 211 and a center of a top surface 223 of the spin chuck 220 corresponds to each other as seen from the top. After the carrier arm 211 stops at the set coordinates P1 (X1, Y1, Z1), the image of the top surface 223 of the spin chuck 220 down below is picked up by the CCD camera 260 positioned at the center portion of the position detecting wafer S.

This image pickup information is transmitted to the wireless receiving device 242 from the wireless transmitter 262. Thereafter, the image pickup information is transmitted to the AGC 104 from the communication device 241, and is transmitted to the host computer 108 on the side of the vender 102 via the Internet 103 from the AGC 104.

The image pickup information received at the communication unit 110 of the host computer 108 is displayed on the display unit 113, and is notified to the person in charge on the side of the vender 102. The person in charge on the side of the vender 102 calculates a deviation between the center position of the position detecting wafer S and the position of the suction port 224 of the spin chuck 220 when the carrier arm 211 stops at the set coordinates P1 (X1, Y1, Z1) based on the image pickup information. A deviation between a center point of an image picked up by, for example, the CCD camera 260 and the position of the suction port 224 taken in the image is measured. The measured value thus calculated, for example, H (+x, +y, 0) is made a correction value of the set coordinates P1 (X1, Y1, Z1).

The calculated correction value is inputted into the input unit 112 by the person in charge on the side of, for example, the vender 102, and is transmitted to the AGC 104 from the communication unit 110 as correction information. The transmitted correction information is received at the AGC 104 via the Internet 103, and is further transmitted to the communication device 241 of the coating and developing apparatus M1 from the AGC 104. The correction information received at the communication device 241 is outputted to the control device 240, and the set coordinates P1 (X1, Y1, Z1) set at the control device 240 is changed to set coordinates P2 (X1+x, Y1+y, Z) (P2=P1+H). As a result, the stop position at the destination of the carrier arm 211 is adjusted. Thereafter, pickup of the image of the stop position of the carrier arm 211 by the position detecting wafer S is performed again, and the position after the adjustment is confirmed. When the stop position of the carrier arm 211 is corrected to a suitable position, the operation is finished, and if it is not corrected, the aforesaid operation is repeatedly performed.

According to the above embodiment, the person in charge on the side of the vender 102 can perform the position adjustment for the carrier arm 211 via the Internet 103. Accordingly, when the position adjustment of the carrier arm 211 is to be performed, the person in charge on the side of the vender 102 does not need to visit the factory 101 each time, thus making it possible to perform the position adjustment promptly. Since the person in charge on the side of the vender 102 directly accesses the control device 240 of the carrier arm 211, position adjustment can be performed even when the license is needed for the operation of the carrier arm 211 and there is no licensed person on the side of the factory 101.

Since the image of the actual stop position at the destination of the carrier arm 211 is picked up by the CCD camera 260, the person in charge on the side of the vender 102 can easily calculate the correction value by the picked up image which can be visually captured.

In the above embodiment, the image information of the position detecting wafer S is transmitted by radio, but it may be transmitted through wire.

Figure 30:
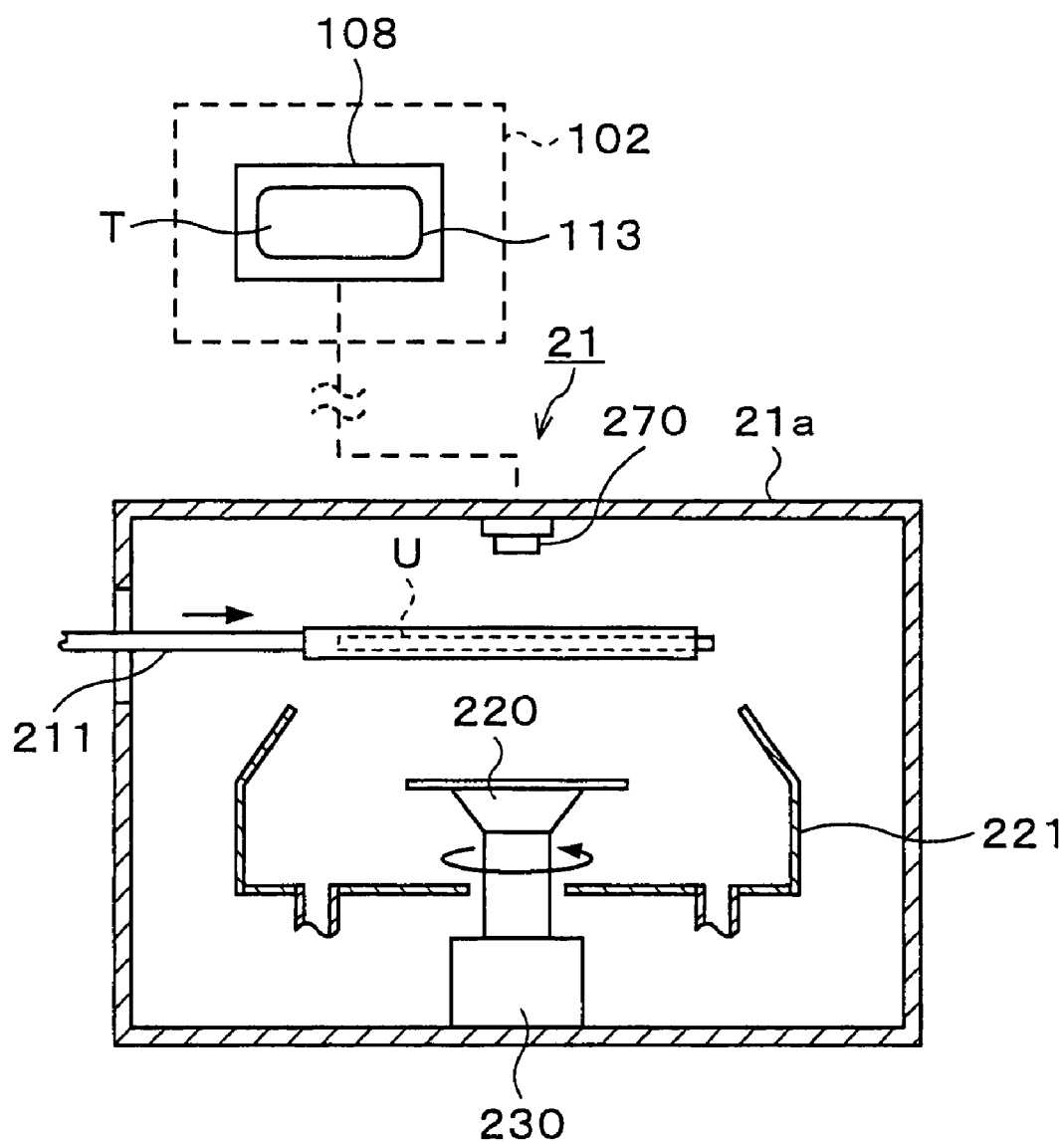
FIG. 30 is an explanatory view in longitudinal section of the resist coating unit in a case in which a CCD camera is mounted thereto.
Figure 31:
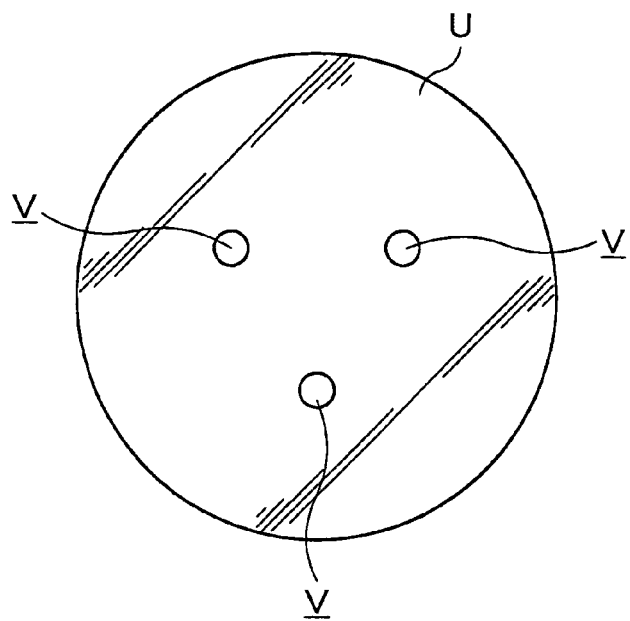
FIG. 31 is a plan view of a position detecting wafer given marks at predetermined positions.
Figure 32:
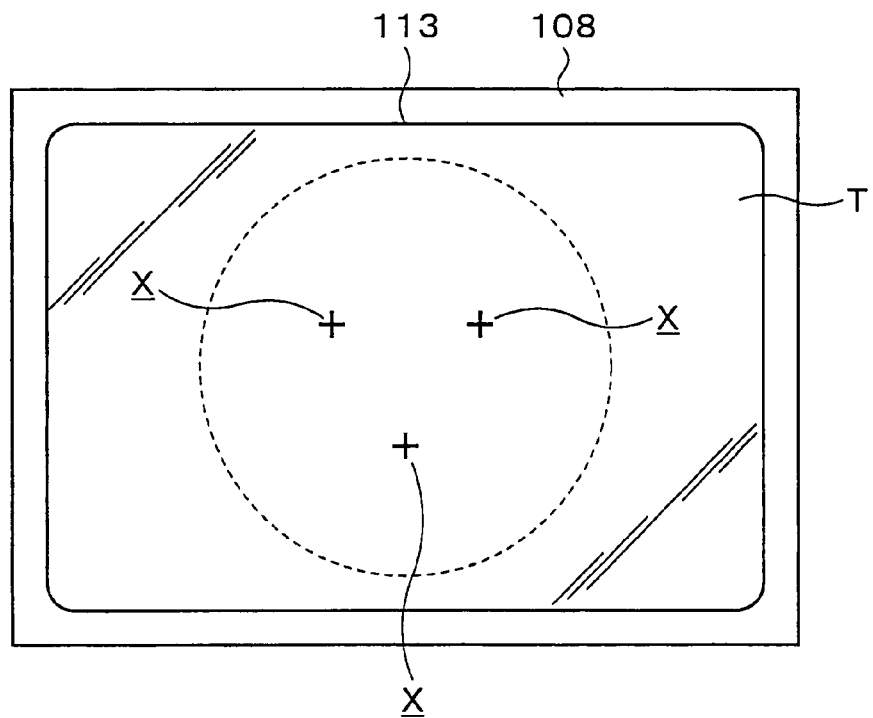
FIG. 32 is an explanatory view showing an example of a screen displayed on a display unit of a host computer.

The CCD camera for detecting the actual stop position at the destination of the carrier arm 211 may be provided to be fixed in, for example, the processing unit of the coating and developing apparatus M1. FIG. 30 shows an example of such a case, and a CCD camera 270 for picking up an image of a position detecting wafer U which is carried is provided at an upper portion of, for example, the resist coating unit 21. The image picked up by the CCD camera 270 is transmitted to, for example, the aforementioned communication device 241, from which the image is transmitted to the host computer 108 on the side of the vender 102, and the image can be displayed on a screen T of the display unit 113, for example. As shown in FIG. 31, the position detecting wafer U is given a plurality of marks V on the same radius. Meanwhile, on the screen T displayed on the host computer 108, reference marks X corresponding to the aforesaid marks V, which indicate the accurate position of the destination of the position detecting wafer U, are displayed as shown in FIG. 32.

Figure 33:
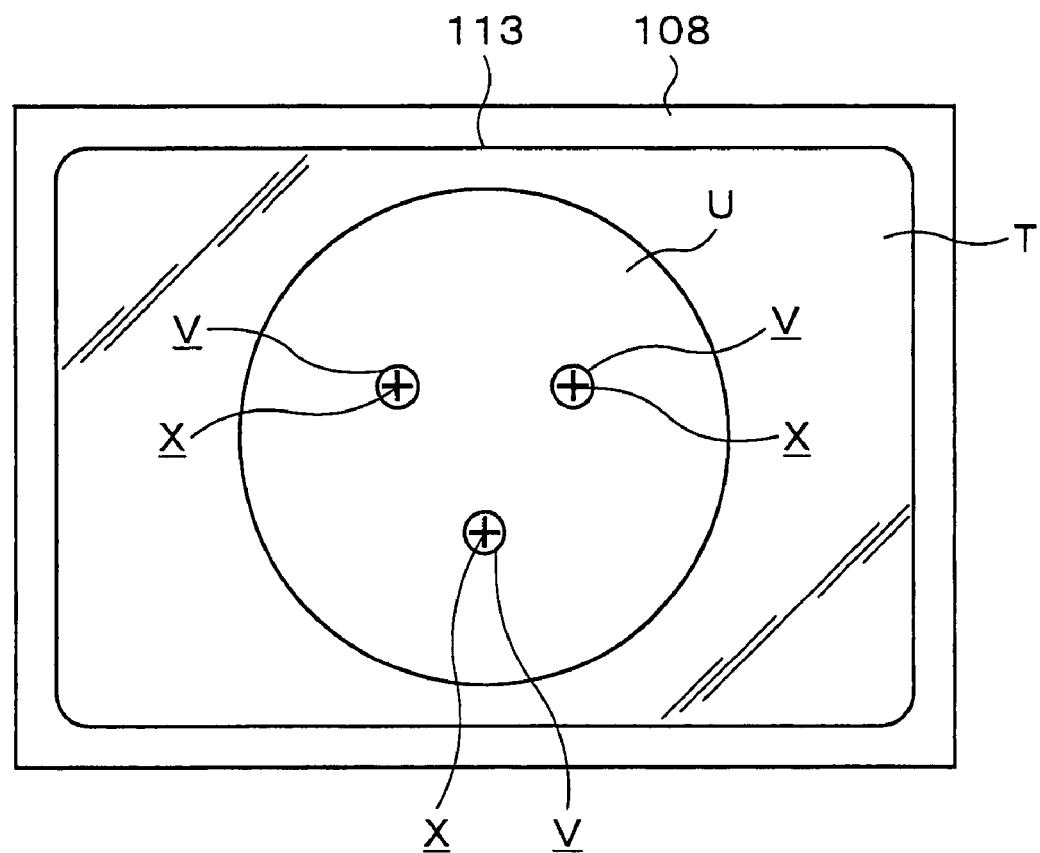
FIG. 33 is an explanatory view showing a display example of the screen when the marks of the position detecting wafer and reference marks are made to correspond to each other.

When the stop position of the carrier arm 211 is to be adjusted, the position detecting wafer U is carried into the resist coating unit 21 by the carrier arm 211, where the image of it is picked up by the CCD camera 270. The picked up image is transmitted to the host computer 108 of the vender 102 by the communication device 241, and displayed on the screen T of the display unit 113. The carrier arm 211 is operated from the side of the vender 102, and the carrier arm 211 is moved so that the marks V and the reference marks X correspond to each other as shown in FIG. 33. By doing so, the accurate stop position of the destination is recognized by the carrier arm 211, and the stop position adjustment of the carrier arm 211 can be performed. The position detecting wafer U may be rotated by a predetermined angle by the spin chuck 220 each time, and the image may be picked up by the CCD camera 270 for each predetermined angle, whereby it may be confirmed that the marks V provided on the same radius correspond to the reference marks X at the each angle.

As a result, a fine positional deviation of the position detecting wafer U can be detected, thus making it possible to increase accuracy of the stop position adjustment.

Figure 34:
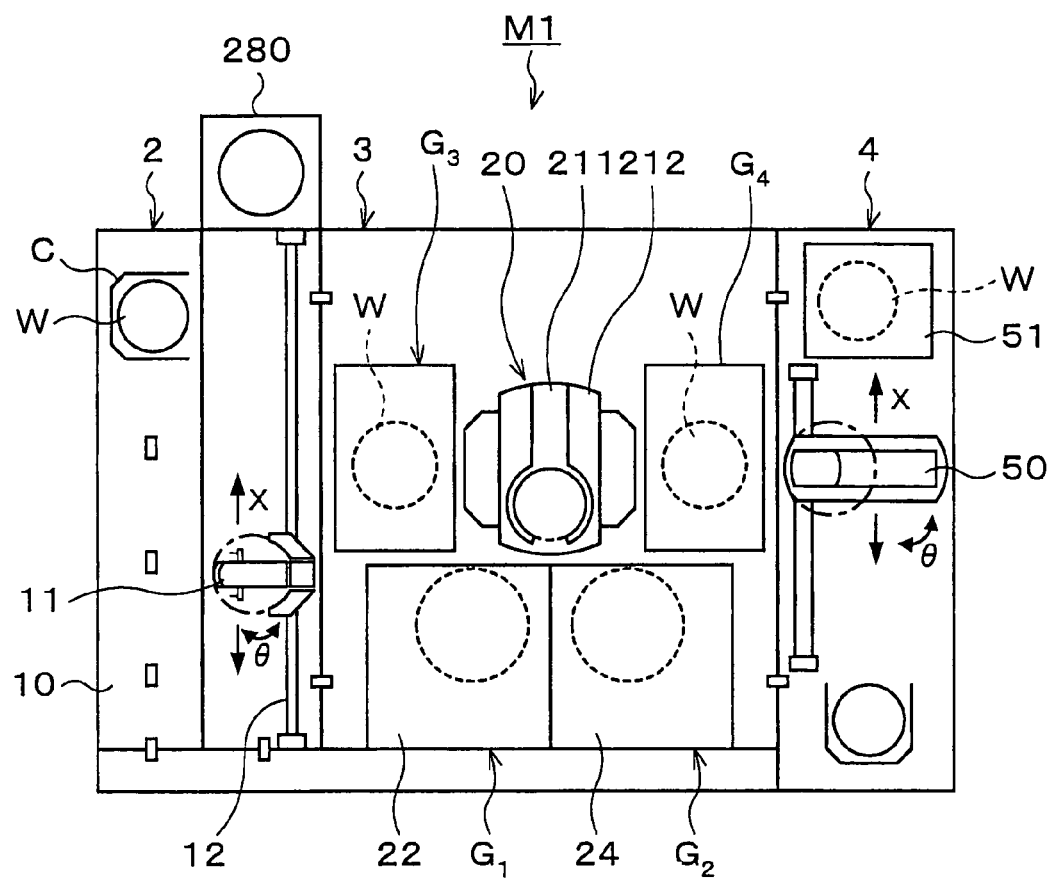
FIG. 34 is a plan view showing a configuration of the coating and developing apparatus in a case in which a waiting part of the position detecting wafer is provided.

In the aforesaid embodiment, the position detecting wafer S is manually supported on the carrier arm 211, but it may be automatically supported. FIG. 34 shows an example in such a case, and a waiting part 280 at which the position detecting wafer S is waited is provided at a back face side of the cassette station 2 of the coating and developing apparatus M1. The wafer carrier unit 11 is made accessible to the waiting part 280. On the position adjustment of the carrier arm 211, the position detecting wafer S is carried out of the waiting part 280 by the wafer carrier unit 11, and delivered to the main carrier unit 20 via the extension unit 33. By dosing so, the operation of placing the position detecting wafer S on the carrier arm 211 can be automated. It is not always necessary to position an operator at the coating and developing apparatus M1, and the placement operation of the position detecting wafer S can be performed by a remote operation. The wafer carrier unit 11 and the carrier arm 211 may be operated from the side of the vender 102 in the remote place, and in such a case, the position adjustment of the carrier arm 211 can be completely automated.

The aforesaid embodiment is in the case in which the destination of the carrier arm 211 for which the adjustment is performed is the resist coating unit 21, but the present invention can be also applied when the destination is the other processing unit, for example, the resist coating unit 23, the developing units 22 and 24, the cooling units 30, 31, and 40, the adhesion unit 32, the extension units 33 and 42, the prebaking units 34 and 35, the extension and cooling unit 41, the post exposure baking units 43 and 44, the post baking units 45 and 46, the edge exposure unit 51, and the like.

Especially when the destination is the baking processing-related unit such as the prebaking units 34 and 35, the post exposure baking units 43 and 44, the post baking units 45 and 46, the cooling units 30, 31 and 40, and the like, a heat plate temperature measuring jig may be used as the position detecting wafer. The heat plate temperature measuring jig is in the same shape as, for example, the wafer W, and can measure an in-plane temperature of the mounted heat plate.

Figure 35:
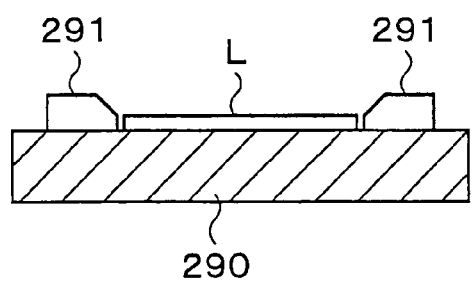
FIG. 35 is an explanatory view in longitudinal section of a heat plate in a case in which a heat plate temperature measuring jig is properly placed thereon.
Figure 36:
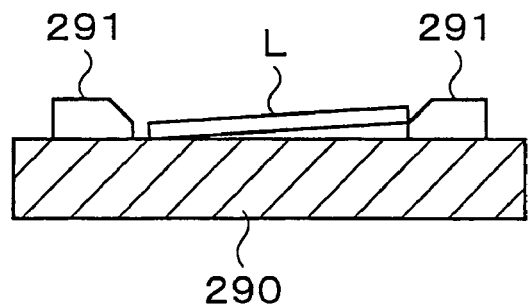
FIG. 36 is an explanatory view in longitudinal section of the heat plate in a case in which the heat plate temperature measuring jig is not properly placed thereon.

When the position adjustment for the carrier arm 211 is performed using this heat plate temperature measuring jig, the heat plate temperature measuring jig is carried onto the heat plate of the baking processing-related unit by the carrier arm 211, for example, and the heat plate temperature measuring jig is mounted on the heat plate. Then, the temperature distribution on the surface of the heat plate is measured by the heat plate temperature measuring jig. In this situation, when a heat plate temperature measuring jig L is placed on a suitable position of a heat plate 290 as shown in FIG. 35, for example, the temperature distribution of the measured temperature within the plane of the heat plate becomes uniform. On the other hand, if the heat plate temperature measuring jig L is not carried to the suitable position, and is placed to ride on a wafer guide 291 as shown in FIG. 36, for example, the measured temperature of the portion separated from the heat plate 290 reduces, and the temperature distribution within the plane of the heat plate 290 becomes uneven. From this temperature distribution, the direction in which the heat plate temperature measuring jig L rides thereon is known. Accordingly, the person in charge on the side of the vender 102 can calculate a correction value of the destination of the carrier arm 211 based on the aforesaid temperature distribution. The calculated correction value is transmitted to the coating and developing apparatus M1 from the side of the vender 102 as in the aforesaid embodiment, and the stop position at the destination of the carrier arm 211 is adjusted. In such a case, the stop position of the actual destination of the carrier arm 211 can be detected by utilizing the jig for measuring the heat plate temperature, and therefore there is no need to use the special position detecting wafer S. Accordingly, the stop position adjustment for the carrier arm 211 can be performed with use of the existing measuring jig for heat plate temperature.

In the aforementioned embodiment, the detection of the actual stop position at the destination of the carrier arm 211 is performed by using the position detecting wafer S, the CCD camera 270 and the like, but it may be performed with other methods. For example, as described in Japanese Patent Laid-open No. 2000-349133, the nozzle arm mounted with the photoelectric sensor moves in the fixed direction X on the dummy wafer held by the spin chuck, and the edge position of the dummy wafer is detected by the photoelectric sensor. Thereafter, the dummy wafer is rotated by, for example, 90 degrees each time to detect the edge position of the dummy wafer at each position. By doing so, the edge position at every 90 degrees of the dummy wafer and the position of the nozzle arm at that time are detected, and based on this detection information, the stop position at the destination of the carrier arm 211 carrying the dummy wafer can be detected. The detection information is transmitted to the side of the vender as in the aforementioned embodiment, and based on the detection information, the transfer position of the carrier arm is adjusted from the remote place.

In the baking processing-related unit such as the post exposure baking unit 73, the stop position of the carrier arm 211 may be detected by using the positioning jig equipped with the transmission type photoelectric sensor capable of scanning in the X-direction and θ-direction (See Japanese Patent Laid-open No. 2000-349133). In this detecting method, when the positioning jig is carried onto the heat plate by the carrier arm 211, the position of the center pin at the center of the heat plate is detected by the photoelectric sensor, and the position at the destination of the positioning jig is detected based on the detection. Thus, the stop position of the destination of the carrier arm 211 can be detected. The detection information which is detected is transmitted to the side of the vender as in the embodiment described above, and the transfer position of the carrier arm is adjusted from the remote place based on the detection information.

The aforesaid photoelectric sensor may be mounted to the side of the carrier arm 211 to detect the stop position of the carrier arm 211 (See Japanese Patent Laid-open No. 2000-349133). The CCD camera swingable in the up-and-down direction may be mounted to the carrier arm 211 and the position of the center pin is detected by the CCD camera, whereby the stop position of the carrier arm 211 may be detected (See Japanese Patent Laid-open No. 2000-349133).

In the aforesaid embodiment, the present invention is applied to the position adjustment of the main carrier unit 20 including the carrier arm 211, but the present invention can be also applied to the other carrier units for carrying the wafer W, for example, the wafer carrier units 11 and 50.

Further, in the above embodiment, the adjustment examples of the carrier for carrying the wafer W are shown, but the present invention may be also applied to the carriers for carrying the other objects to be carried, for example, the nozzle arm 231 for carrying the resist solution discharge nozzle 222 of the resist coating unit 21.

Figure 37:
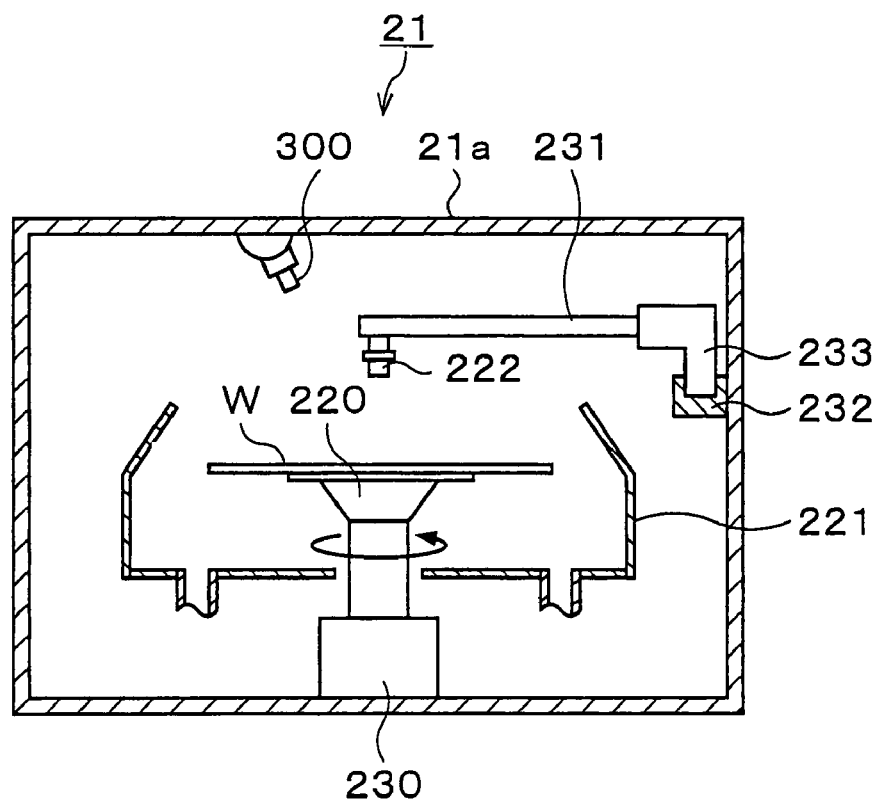
FIG. 37 is an explanatory view in longitudinal section showing a configuration of the resist coating unit in which the CCD camera is provided.

In order to carry out such an example, a CCD camera 300 capable of picking up the image of the wafer W on the spin chuck 220 is provided at an upper portion of the resist coating unit 21 as shown in FIG. 37, for example. The image pickup information of the image picked up with the CCD camera 300 can be outputted to the communication device 241 of the control section 203.

The resist solution discharge nozzle 222 is moved to above the center portion of the wafer W, which is the destination, by the nozzle arm 231. Next, the wafer W is rotated by the spin chuck 220, and the resist solution is discharged to the rotated wafer W from the resist solution discharge nozzle 222. In this situation, the image of the discharge position of the resist solution to the wafer W is picked up by the CCD camera 300, and as in the aforesaid embodiment, the image pickup information is transmitted to the side of the vender 102 from the communication device 241 via the Internet 103. The skilled person in charge on the side of the vender 102 confirms the discharge position of the resist solution based on the image pickup information, and when the discharge position is deviated from the center of the wafer W, the skilled person in charge calculates the correction value of the stop position of the nozzle arm 231, which sets the discharge position at the center of the wafer W. The correction value is transmitted to the control device 240 of the coating and developing apparatus M1 as the correction information as in the aforesaid embodiment, and the stop position of the nozzle arm 231 is adjusted. Thus, the skilled person in charge on the vender side performs the position adjustment of the nozzle arm 231 promptly and properly.

In the aforesaid embodiment, the carrier of the resist solution discharge nozzle 222 is explained, but the present invention can be applied to the carriers of the other nozzles, for example, a solvent supplying nozzle for supplying a solvent before the resist solution is discharged to the wafer W, a developing solution supplying nozzle for supplying a developing solution, a washing fluid supplying nozzle for washing the wafer W, and the like.

The embodiments described in the above are for the coating and developing apparatuses, but the present invention may be applied to the other processing apparatus, for example, the aligner, the etching apparatus, the inspection apparatus, and the like. For example, the arm position adjusting system 200 may be applied to the processing apparatuses other than the coating and developing apparatus. Further, the arm position adjusting system 200 may be applied to the aforesaid plurality of kinds of processing apparatuses. Further, the arm position adjusting system 200 can be applied even in a case in which the processing apparatuses for which arm position adjustment is performed are in the factories at a plurality of places. The host computers 108 on the side of the vender 102 may be provided at a plurality of spots instead of the one spot.

The present invention is applied to the processing apparatuses for the wafer, but the present invention can be also applied to the processing apparatuses for the substrates other than the wafer, for example, an LCD substrate, a mask reticle substrate for a photo mask and the like.

INDUSTRIAL APPLICABILITY

The present invention is useful to solve the problem occurring in an apparatus which manufactures semiconductor devices and the like.

What is claimed is:

1. A carrier adjusting system which calibrates a stop position of a carrier which carries an object, the carrier adjusting system comprising:
    a control device which controls the movement and stopping of said carrier;
    a detector which detects a location of an actual stop position of said carrier when stopped by the control device and generates location information of the actual stop position;
    an obtaining device in communication via the internet with the control device and the detector, the obtaining device receiving the location information from the detector;
    a providing device, in communication with the obtaining device and the control device via the internet, operative for comparing whether the location information received by the obtaining device comports with reference location information representative of a desired stop position of the carrier; and
    a processing apparatus,
    wherein, if the location information and the reference location information fail to comport with each other, the providing device calculates correction information and provides the correction information to the control device so that the control device combines the correction information and the location information in order for the control device to thereafter move the carrier to the desired stop position;
    wherein said detector includes an image pickup device;
    wherein the object is a substrate;
    wherein said image pickup device is provided at a detecting substrate in a same shape as the substrate;
    wherein the object is a substrate;
    wherein said image pickup device is provided to be fixed to said processing apparatus operative to pick up an image of the detecting substrate carried to the stop position of said carrier;
    wherein said detecting substrate is given a mark by which a position of the detecting substrate after being carried is recognized on an image of said image pickup device; and
    wherein a reference mark on occasion of adjusting the stop position of said carrier is displayed on a screen on which the image of said image pickup device is displayed.

2. The carrier adjusting system as set forth in claim 1, wherein the object is a treatment solution supplying member which supplies a treatment solution to a substrate.

3. The carrier adjusting system as set forth in claim 1, wherein said processing apparatus is provided with a waiting part at which said detecting substrate is waited; and wherein said carrier is able to carry said detecting substrate waited at said waiting part.

4. The carrier adjusting system as set forth in claim 1, wherein said processing apparatus is provided with a waiting part at which said detecting substrate is waited; and wherein said carrier is able to carry said detecting substrate waited at said waiting part.

* * * * *